United States Patent
Lee et al.

(10) Patent No.: US 11,765,880 B2
(45) Date of Patent: Sep. 19, 2023

(54) METHOD OF MANUFACTURING SEMICONDUCTOR DEVICE

(71) Applicant: SAMSUNG ELECTRONICS CO., LTD., Suwon-si (KR)

(72) Inventors: Yanghee Lee, Incheon (KR); Seokhan Park, Seongnam-si (KR); Sungchang Park, Hwaseong-si (KR); Boun Yoon, Seoul (KR); Ilyoung Yoon, Hwaseong-si (KR); Youngsuk Lee, Hwaseong-si (KR); Junseop Lee, Hwaseong-si (KR); Seungho Han, Seoul (KR); Jaeyong Han, Seongnam-si (KR); Jeehwan Heo, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 74 days.

(21) Appl. No.: 17/245,912

(22) Filed: Apr. 30, 2021

(65) Prior Publication Data
US 2022/0115379 A1 Apr. 14, 2022

(30) Foreign Application Priority Data
Oct. 14, 2020 (KR) ........................ 10-2020-0132577

(51) Int. Cl.
*H10B 12/00* (2023.01)
(52) U.S. Cl.
CPC .................................. *H10B 12/01* (2023.02)

(58) Field of Classification Search
CPC ......... H01L 27/10844; H01L 27/10852; H01L 27/10897; H01L 27/10894; H01L 21/31051; H01L 27/1085; H01L 27/10885; H01L 28/90
See application file for complete search history.

(56) References Cited

U.S. PATENT DOCUMENTS

| | | | |
|---|---|---|---|
| 6,365,928 B1 * | 4/2002 | Yang | H10B 12/50 257/306 |
| 9,659,940 B2 | 5/2017 | Park et al. | |
| 9,935,111 B2 | 4/2018 | Kim et al. | |
| 10,535,533 B2 | 1/2020 | Lee et al. | |
| 2008/0237681 A1 * | 10/2008 | Minami | H10B 12/50 257/E27.084 |

(Continued)

FOREIGN PATENT DOCUMENTS

KR 10-0881484 B1 2/2009

*Primary Examiner* — Edward Chin
(74) *Attorney, Agent, or Firm* — Sughrue Mion, PLLC

(57) ABSTRACT

A method of manufacturing a semiconductor device includes: forming a lower structure that includes a substrate and conductive lines on the substrate, within a chip region and an edge region of the lower structure; forming data storage structures on the chip region of the lower structure; forming dummy structures on the edge region of the lower structure; forming an interlayer insulating layer covering the data storage structures and the dummy structures on the lower structure, the interlayer insulating layer including high step portions and low step portions, an upper end of the low step portions being lower than an upper end of the high step portions; and planarizing the interlayer insulating layer.

18 Claims, 18 Drawing Sheets

(56) References Cited

U.S. PATENT DOCUMENTS

| | | | |
|---|---|---|---|
| 2012/0329236 A1* | 12/2012 | Ueda | ....................... H01L 28/91 |
| | | | 257/E21.011 |
| 2017/0098653 A1 | 4/2017 | Koh et al. | |
| 2019/0341358 A1 | 11/2019 | Lee et al. | |
| 2020/0312853 A1* | 10/2020 | Choi | ....................... H10B 12/30 |
| 2021/0304803 A1* | 9/2021 | Kwon | ................. H01L 23/5226 |

* cited by examiner

METHOD OF MANUFACTURING SEMICONDUCTOR DEVICE

CROSS-REFERENCE TO THE RELATED APPLICATION

This application claims the benefit under 35 USC 119(a) of Korean Patent Application No. 10-2020-0132577 filed on Oct. 14, 2020 in the Korean Intellectual Property Office, the disclosure of which is incorporated herein by reference in its entirety.

BACKGROUND

1. Field

Embodiments of the present disclosure relate to a method of manufacturing a semiconductor device, and more particularly, to a method of manufacturing a semiconductor device using a planarization process, and a wafer structure including the semiconductor device formed thereby.

2. Description of Related Art

Research is being conducted to reduce the size of elements constituting semiconductor devices and improve performance. In a dynamic random access memory (DRAM), as capacitors with reduced size are formed, a reliable planarization process is required.

SUMMARY

Example embodiments provide a wafer structure including a semiconductor device having improved reliability.

Example embodiments provide a method of manufacturing a semiconductor device having improved reliability.

According to one or more embodiments, a method of manufacturing a semiconductor device is provided. The method includes: forming a lower structure that includes a substrate and conductive lines on the substrate, within a chip region and an edge region of the lower structure; forming data storage structures on the chip region of the lower structure; forming dummy structures on the edge region of the lower structure; forming an interlayer insulating layer covering the data storage structures and the dummy structures on the lower structure, the interlayer insulating layer including high step portions and low step portions, an upper end of the low step portions being lower than an upper end of the high step portions; and planarizing the interlayer insulating layer, wherein on the chip region, the lower structure includes a core region having a grid pattern, and further includes memory cell regions surrounded by the core region, wherein on the edge region, the lower structure includes a dummy core region having a same grid pattern as the core region, and further includes dummy cell regions surrounded by the dummy core region, wherein the data storage structures are respectively formed on the memory cell regions, and wherein each of the dummy structures is formed to overlap two adjacent ones of the dummy cell regions and a portion of the dummy core region therebetween.

According to one or more embodiments, a method of manufacturing a semiconductor device. The method includes: forming a lower structure that includes a substrate and conductive lines on the substrate, within a chip region and an edge region of the lower structure; forming data storage structures on the chip region of the lower structure, each of the data storage structures having a first width in a first direction; forming dummy structures on the edge region of the lower structure, each of the dummy structures having a second width greater than the first width in the first direction; forming an interlayer insulating layer covering the data storage structures and the dummy structures on the lower structure; and planarizing the interlayer insulating layer, wherein the dummy structures are formed to be spaced apart from each other in the first direction and in a second direction, intersecting the first direction, wherein high step portions of the interlayer insulating layer are respectively formed on the dummy structures, and wherein low step portions, lower than the high step portions, of the interlayer insulating layer are respectively formed between the dummy structures.

According to one or more embodiments, a method of manufacturing a semiconductor device is provided. The method includes: forming a mold structure on a substrate; forming mask patterns aligned in a first direction, at least partially non-aligned in a second direction, intersecting the first direction, and spaced apart from each other in the first direction and the second direction on the mold structure; forming dummy structures by patterning the mold structure using the mask patterns as an etching mask; forming an interlayer insulating layer covering the dummy structures and including high step portions and low step portions, an upper end of the low step portions being lower than an upper end of the high step portions; and planarizing the interlayer insulating layer, wherein the high step portions are respectively formed on the dummy structures, and wherein the low step portions are formed to surround the dummy structures by being interposed between the dummy structures.

BRIEF DESCRIPTION OF DRAWINGS

The above and other aspects, features, and advantages of embodiments of the present disclosure will be more clearly understood from the following detailed description, taken in conjunction with the accompanying drawings, in which.

DETAILED DESCRIPTION

It will be understood that when an element is referred to as being "over," "above," "on," "below," "under," "beneath," "connected to", or "coupled to" another element, it can be directly over, above, on, below, under, beneath, connected to, or coupled to the other element or intervening elements may be present. In contrast, when an element is referred to as being "directly over," "directly above," "directly on," "directly below," "directly under," "directly beneath," "directly connected to", or "directly coupled to" another element, there are no intervening elements present.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, example embodiments of the present disclosure will be described with reference to the accompanying drawings.

Figure 1:
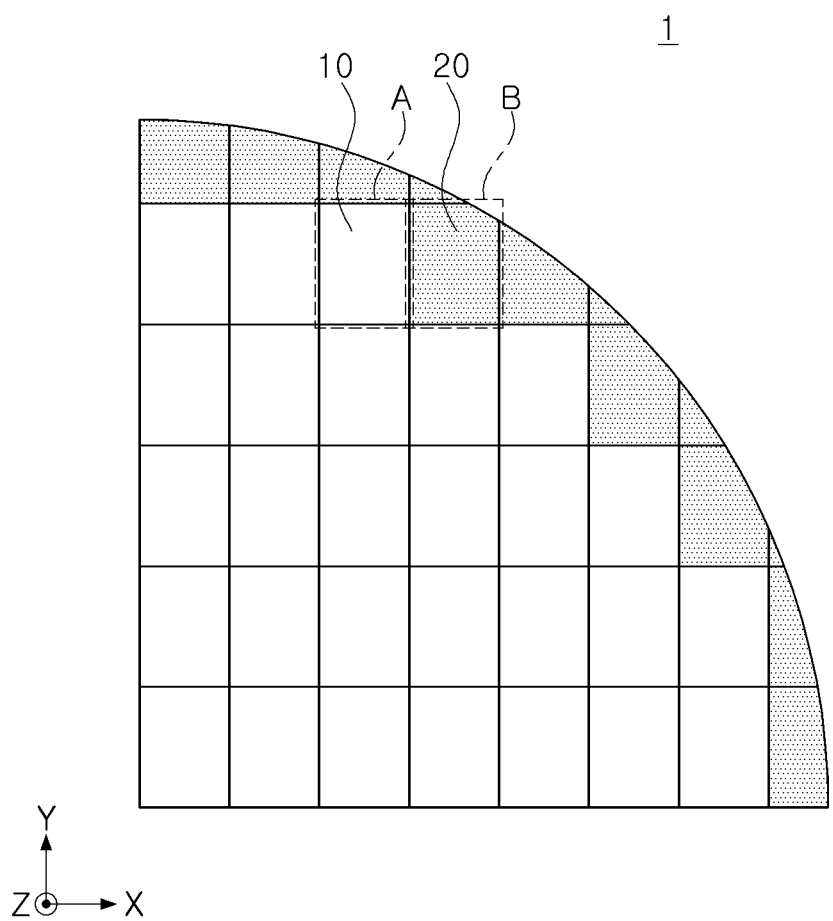
FIG. 1 is a plan view schematically illustrating one region of a wafer structure including a semiconductor device according to an example embodiment of the present disclosure.
Figure 2A:
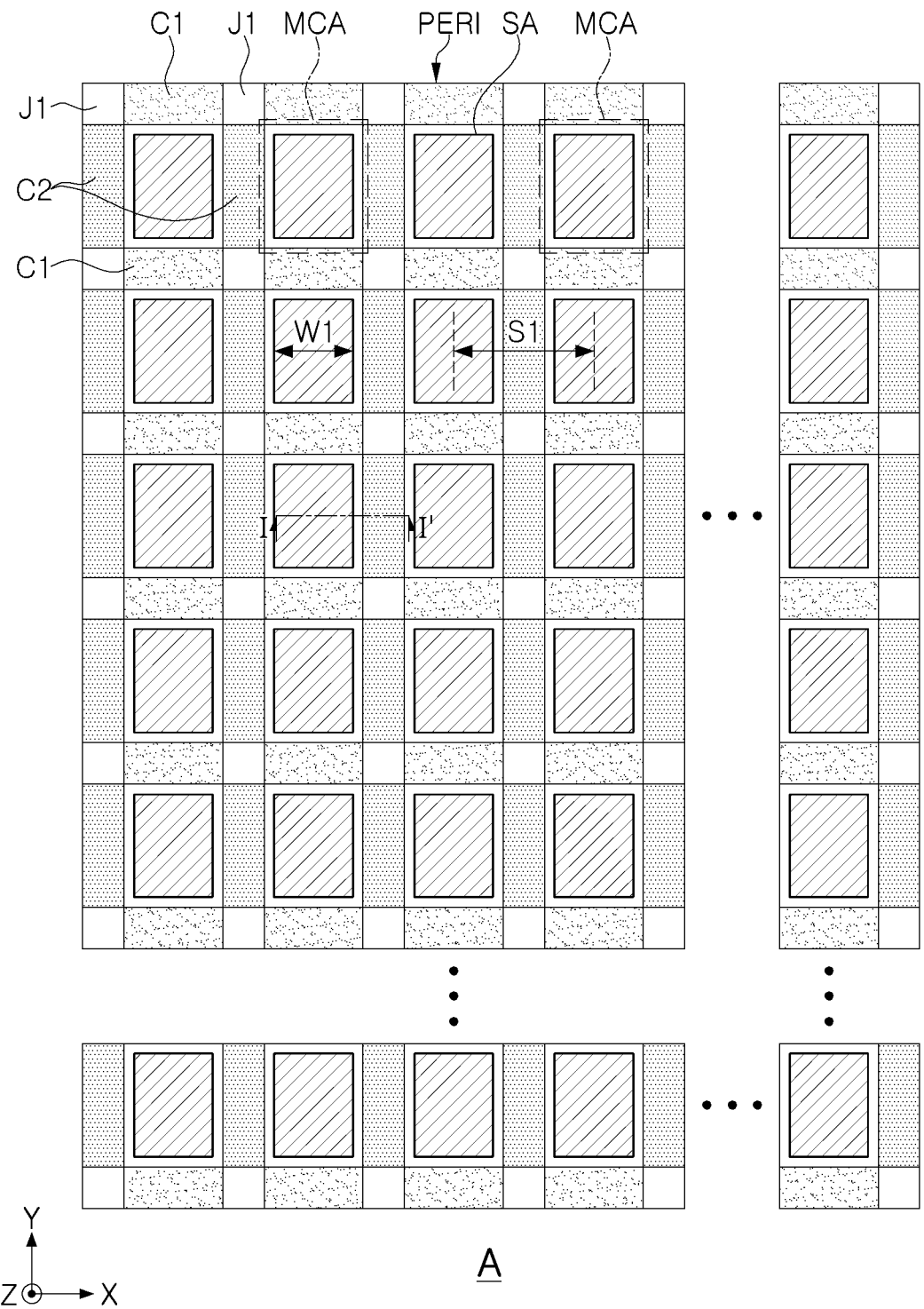
FIG. 2A is a partially enlarged view illustrating region "A" of FIG. 1 and is a plan view schematically illustrating a layout of a chip region of the wafer structure.
Figure 2B:
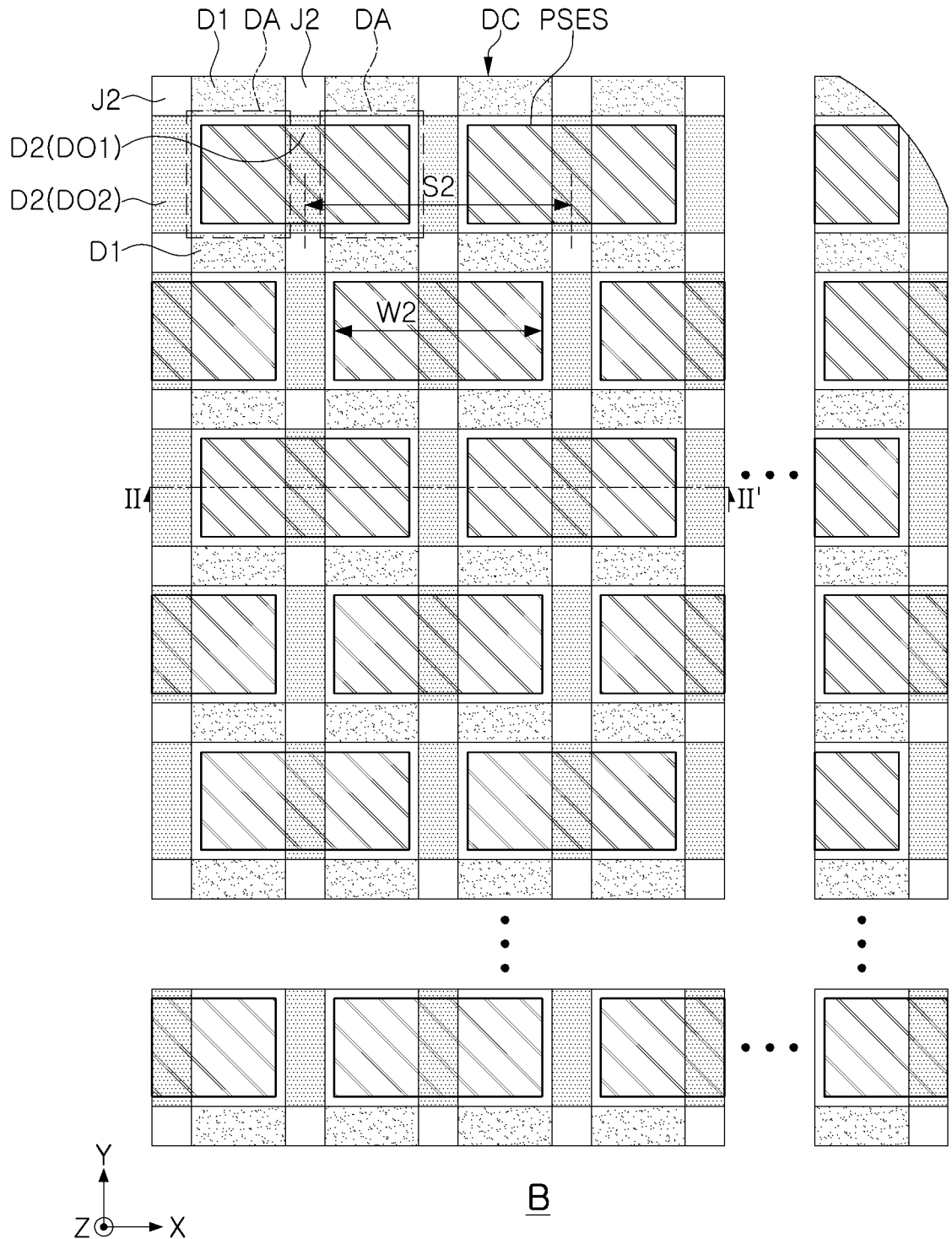
FIG. 2B is a partially enlarged view illustrating region "B" of FIG. 1 and is a plan view schematically illustrating a layout of an edge region of the wafer structure.

FIG. 1 is a plan view schematically illustrating one region of a wafer structure including a semiconductor device according to an example embodiment of the present disclosure. FIG. 2A is a partially enlarged view illustrating region "A" of FIG. 1 and is a plan view schematically illustrating a layout of a chip region of the wafer structure. FIG. 2B is a partially enlarged view illustrating region "B" of FIG. 1 and is a plan view schematically illustrating a layout of an edge region of the wafer structure.

Referring to FIGS. 1 to 2B, a wafer structure 1 may include a plurality of a chip region 10 and a plurality of an edge region 20. The plurality of the edge region 20 may be disposed to surround the plurality of the chip region 10 in an edge region of the wafer structure 1. Hereinafter, as illustrated in FIGS. 2A and 2B, one chip region 10 and one edge region 20 will be described.

The chip region 10 may include a plurality of a memory cell region MCA and a peripheral circuit region PERI surrounding the plurality of the memory cell region MCA.

Each of the plurality of the memory cell region MCA may be a region in which a memory cell array of a dynamic random access memory (DRAM) element is disposed. In each of the plurality of the memory cell region MCA, a data storage structure SA including a capacitor of the DRAM element may be disposed. The number of the plurality of the memory cell region MCA disposed in the chip region 10 may be variously changed according to example embodiments.

The peripheral circuit region PERI may be a region in which circuit elements for driving the DRAM element are disposed. The peripheral circuit region PERI may have a grid pattern. For example, the peripheral circuit region PERI may surround the memory cell region MCA indicated by a dotted box in FIG. 2A. The peripheral circuit region PERI may also be referred to as a core region. The peripheral circuit region PERI may include a first core region C1, a second core region C2, and a first conjunction region J1. The first conjunction region J1 may be arranged at a point where the first core region C1 and the second core region C2 intersect.

The first core region C1 may be a bit line sense amplifier (S/A) block of the DRAM element, and the second core region C2 may be a sub word line driver (SWD) block of the DRAM element. A bit line sense amplifier disposed in the sense amplifier block may sense and amplify data in a memory cell and store data in the memory cell. A sub word line driver disposed in the sub word line driver block may select and drive word lines of the memory cell. Power drivers and ground drivers for driving the bit line sense amplifier may be alternately disposed in the first conjunction region J1.

In the peripheral circuit region PERI, the second core region C2, which is a plurality of sub word line blocks, may be arranged in an extension direction of the word line of the memory cell region MCA, for example, in a first direction X. In the peripheral circuit region PERI, the first core region C1, which is a plurality of sense amplifier blocks, may be arranged in an extension direction of the bit line of the memory cell region MCA, for example, in a second direction Y. The first direction X and the second direction Y may intersect each other and may be perpendicular to a vertical direction Z.

Figure 7:
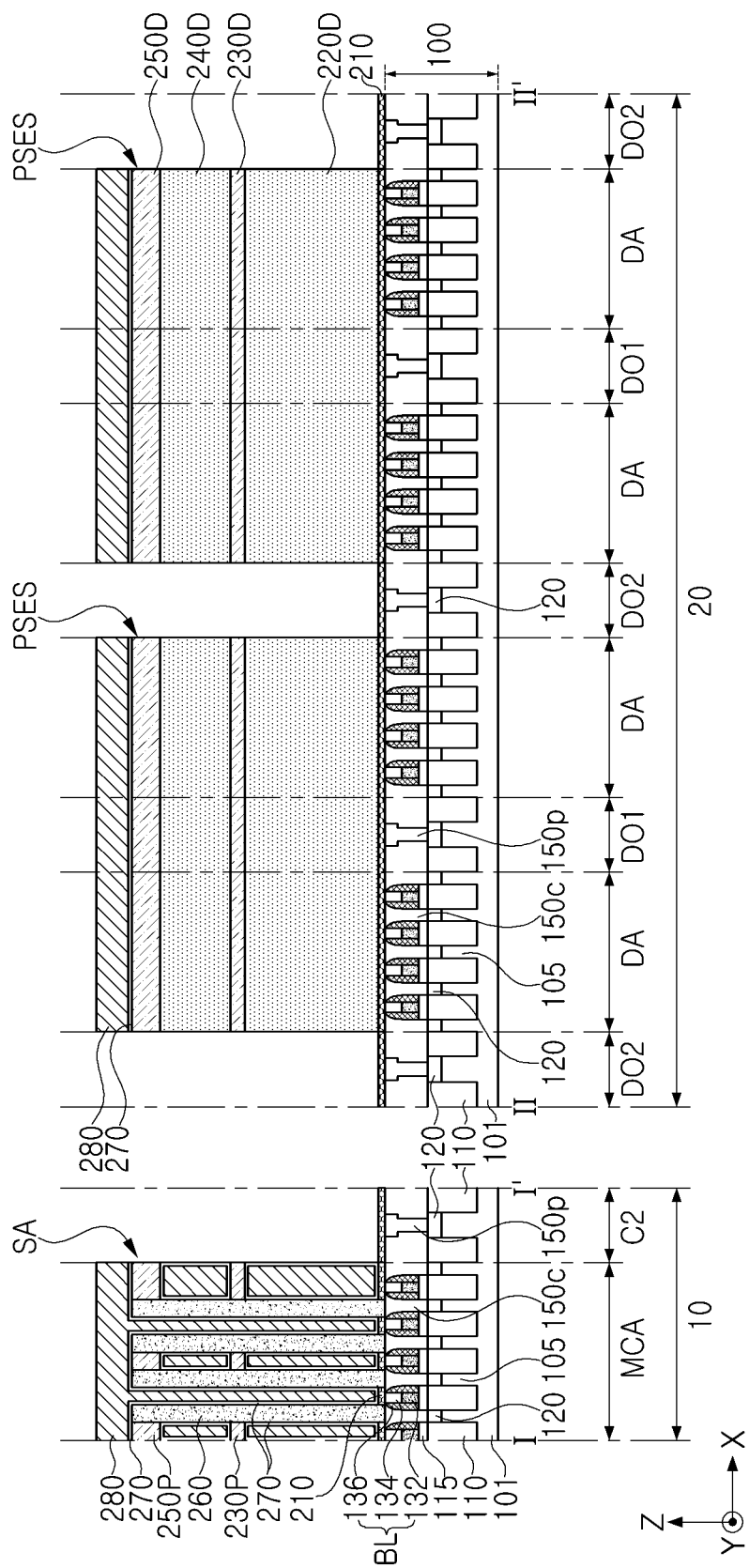
FIG. 7 is a seventh view, that is a cross-sectional view along lines I-I' and illustrating a part of the process sequence to explain the method of manufacturing the semiconductor device according to the example embodiment of the present disclosure.

The data storage structure SA may include conductive layers 260, a dielectric layer 270, an electrode layer 280, a lower support pattern 230P, and an upper support pattern 250P on a substrate 101, as illustrated in FIG. 7. The conductive layers 260, the dielectric layer 270, and the electrode layer 280 may constitute a capacitor of the DRAM element.

The edge region 20 may include a plurality of dummy cell regions DA and a dummy core region DC surrounding the plurality of dummy cell regions DA.

The edge region 20 may be a region in which dummy structures such as a photo-sensitive-edge-stop (PSES) structure PSES are disposed. The number of the PSES structure (PSES) disposed on the edge region 20 may be variously changed according to example embodiments.

The plurality of dummy cell regions DA are regions corresponding to the plurality of the memory cell region MCA, and may have the same arrangement as the plurality of the memory cell region MCA. A lower structure 100 (refer to FIG. 3B) disposed in the plurality of dummy cell regions DA may have the same or similar cross-sectional structure as a lower structure disposed in the plurality of the memory cell region MCA.

The dummy core region DC is a region corresponding to the peripheral circuit region PERI, and may have the same arrangement as the peripheral circuit region PERI. The dummy core region DC may have the same grid pattern as the peripheral circuit region PERI. The dummy core region DC may include a first dummy core region D1, a second dummy core region D2, and a second conjunction region J2. The second conjunction region J2 may be arranged at a point where the first dummy core region D1 and the second dummy core region C2 intersect. The first dummy core region D1 may be arranged parallel to the first core region C1 in the second direction Y. The second dummy core region D2 may be arranged parallel to the second core region C2 in the first direction X.

A lower structure 100 (refer to FIG. 3B) disposed in the dummy core region DC, for example, the second dummy core region D2(DO1) and the second dummy core region D2(DO2) may have the same or similar cross-sectional structure as a lower structure disposed in the peripheral circuit region PERI.

The PSES structure (PSES) may have a different shape from the data storage structure SA of the memory cell region MCA.

Referring to FIGS. 2A and 2B together, the PSES structure (PSES) may have a larger size than the data storage structure SA. For example, the data storage structure SA may have a first width W1 in the first direction X, and the PSES structure (PSES) may have a second width W2 greater than the first width W1 in the first direction X. The data storage structure SA and the PSES structure (PSES) may have the same width in the second direction Y.

In an example embodiment, the second width W2 may be greater than about twice the first width W1. The second width W2 may be about 2 times to about 3 times the first width W1. The second width W2 may be about 2 times to about 2.5 times the first width W1. Thereby, as described below, a chemical mechanical polishing (CMP) process having improved reliability may be provided by optimizing a rate of step removal of the CMP process.

The plurality of the PSES structure (PSES) may have a different arrangement from the data storage structure SA of the memory cell region MCA.

As illustrated in FIG. 2A, the plurality of the data storage structure SA may be spaced apart from each other by a predetermined distance in the first direction X and the second direction Y, and may be aligned with each other in the first direction X and the second direction Y. However, as illustrated in FIG. 2B, the plurality of the PSES structure (PSES) arranged adjacently in the first direction X are aligned with each other in the first direction X, but the plurality of the PSES structure (PSES) adjacently arranged in the second direction Y may not be aligned with each other in the second direction Y. In the present specification, "aligned" means that the centers of each of the first structure and the second structure adjacent in the first direction are aligned in the first direction, and "non-aligned" means that the centers of each of the first structure and the second structure adjacent in the second direction are non-aligned in the second direction. The plurality of the PSES structure (PSES) may also be spaced apart by a predetermined distance in the first direction X and the second direction Y, and may be disposed in an island type.

As illustrated in FIG. 2A, the plurality of the data storage structure SA are aligned and disposed, but as illustrated in FIG. 2B, the plurality of the PSES structure (PSES) may be arranged in a zigzag arrangement in the second direction Y. For example, a pair of the PSES structure (PSES) facing each other in the first direction X have adjacent first and second corners, but a corner of another PSES structure (PSES) disposed adjacent to the pair of the PSES structure (PSES) in the second direction Y may not be adjacent to the first and second corners.

The plurality of the PSES structure (PSES) are arranged in a zigzag arrangement, so that the second dummy core region D2 may be divided into an overlapping portion DO1 and a non-overlapping portion DO2.

For example, one PSES structure (PSES) may be disposed over a pair of dummy cell regions DA adjacent to each other among the plurality of dummy cell regions DA and the overlapping portion DO1 of the second dummy core region D2 disposed therebetween. One PSES structure (PSES) may be disposed to overlap the pair of dummy cell regions DA and the overlapping portion DO1. The non-overlapping portion DO2 may be disposed so as not to overlap the PSES structure (PSES). The overlapping portion DO1 and the non-overlapping portion DO2 may be alternately arranged in the first direction X, and may be alternately arranged in the second direction Y.

Referring to FIGS. 2A and 2B together, the plurality of the data storage structure SA of the plurality of the memory cell region MCA may be arranged at a first pitch S1 in a first direction X, and the plurality of the PSES structure (PSES) may be arranged at a second pitch S2 that is greater than the first pitch S1 in the first direction X. The plurality of the data storage structure SA may be arranged at a third pitch in the second direction Y, and the plurality of the PSES structure (PSES) may be arranged at a fourth pitch, which is substantially the same as the third pitch in the second direction Y. Here, "pitch" may mean a distance between the centers of adjacent structures.

In an example embodiment, the second pitch S2 may be substantially about twice the first pitch S1. Here, the meaning of "substantially about" can be understood as a concept including errors occurring in the process, and for example, the second pitch S2 may be about 1.9 times to about 2.1 times the first pitch S1. By the arrangement of the PESE structures PSES, as described above, the CMP process having improved reliability may be provided by optimizing the rate of step removal of the CMP process.

Figure 11:
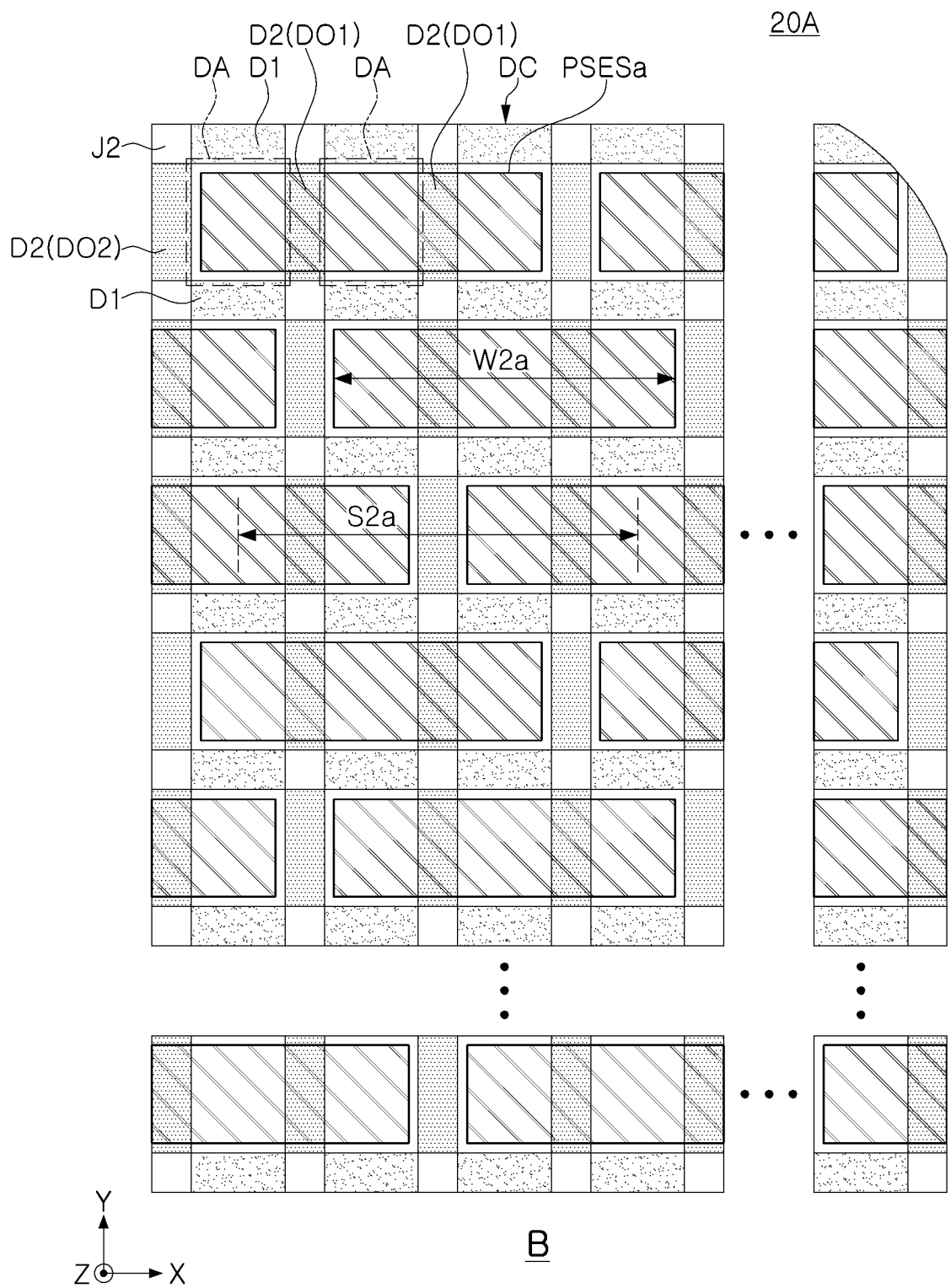
FIG. 11 is a first partially enlarged view corresponding to the region "B" of FIG. 1 and is a plan view schematically illustrating a layout of an edge region of the wafer structure.
Figure 12:
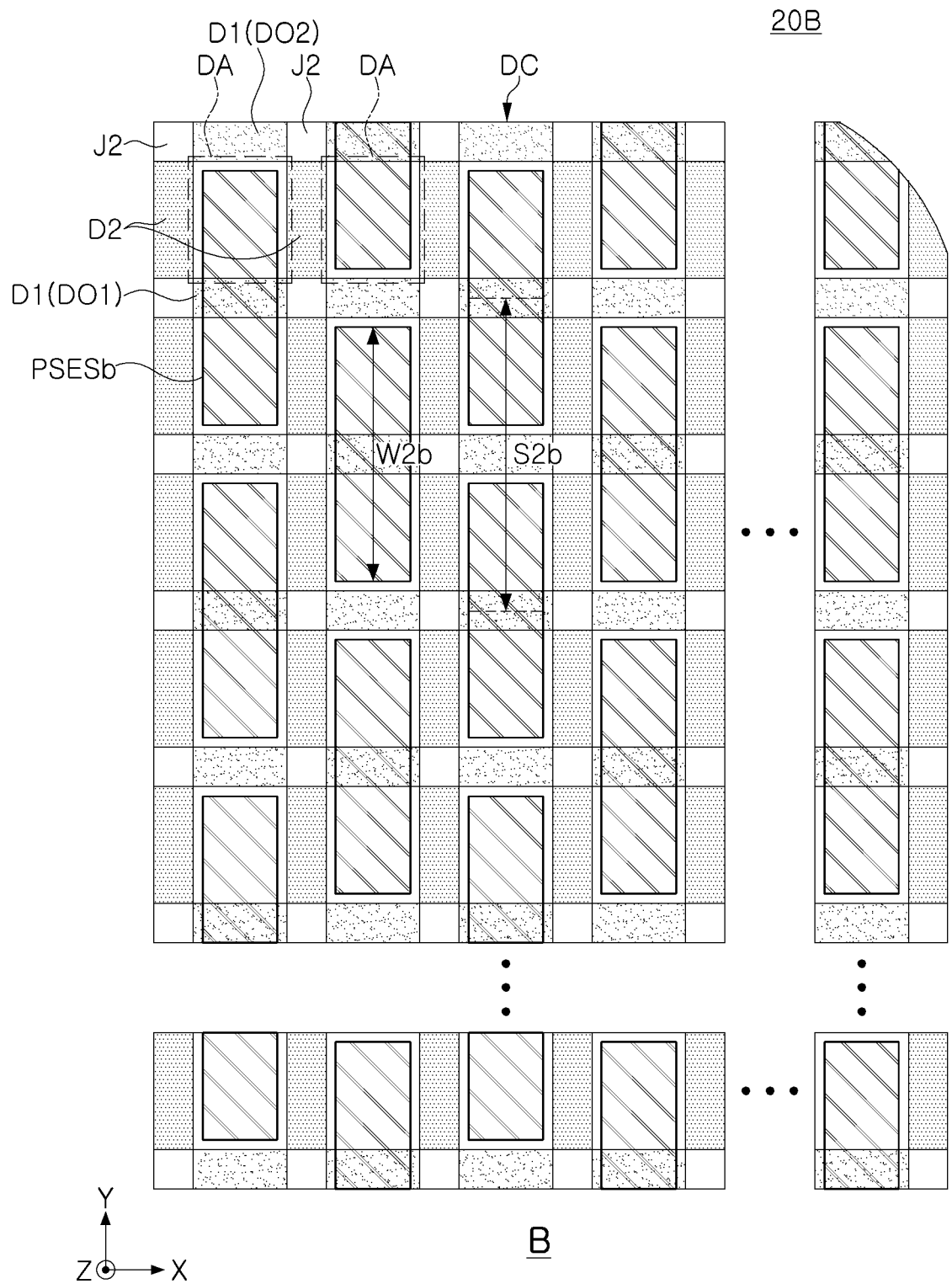
FIG. 12 is a second partially enlarged view corresponding to the region "B" of FIG. 1 and is a plan view schematically illustrating a layout of an edge region of the wafer structure.
Figure 13:
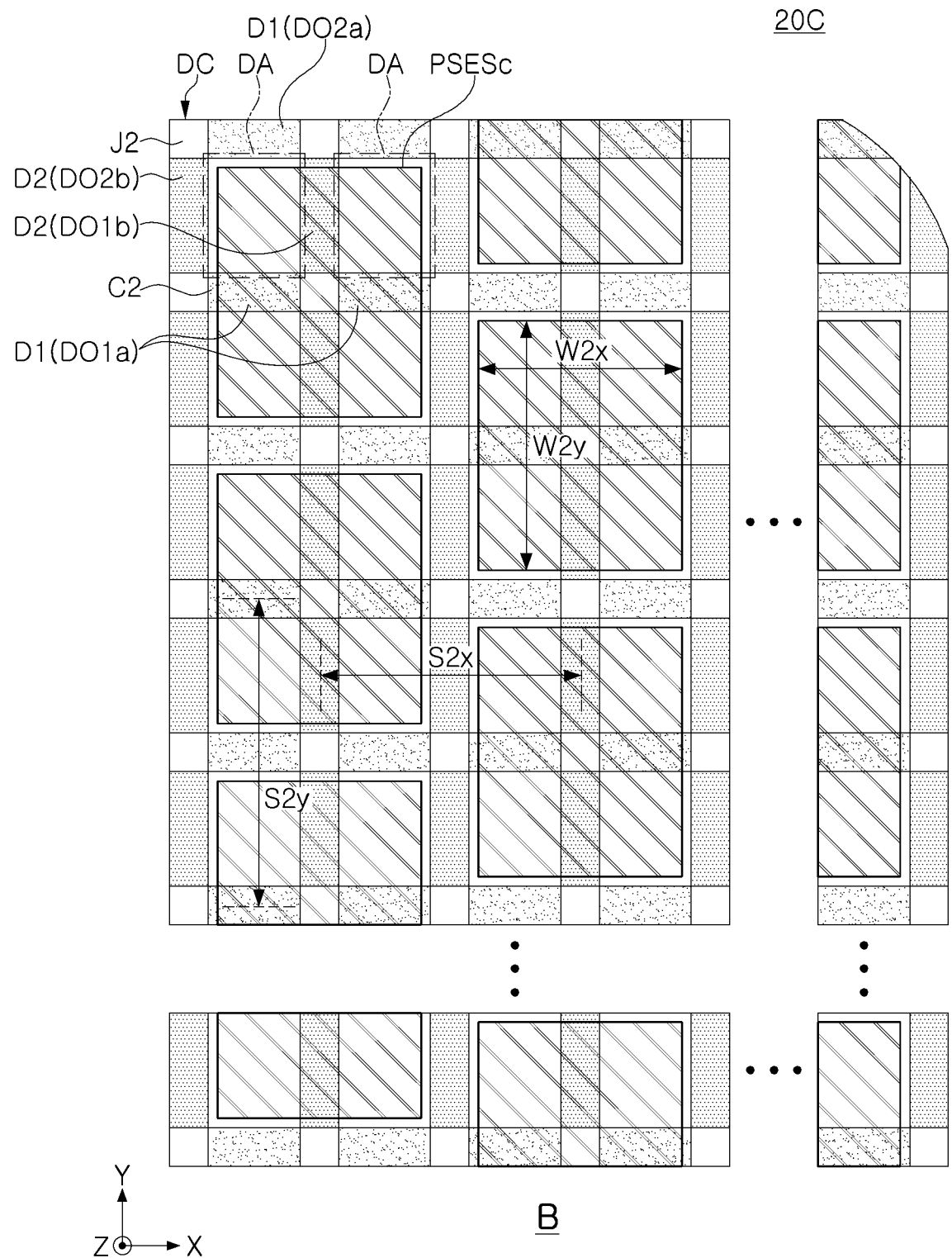
FIG. 13 is a third partially enlarged view corresponding to the region "B" of FIG. 1 and is a plan view schematically illustrating a layout of an edge region of the wafer structure.

However, the arrangement of the plurality of the data storage structure SA and the plurality of the PSES structure (PSES) may be variously changed as illustrated in FIGS. 11 to 13.

Figure 3A:
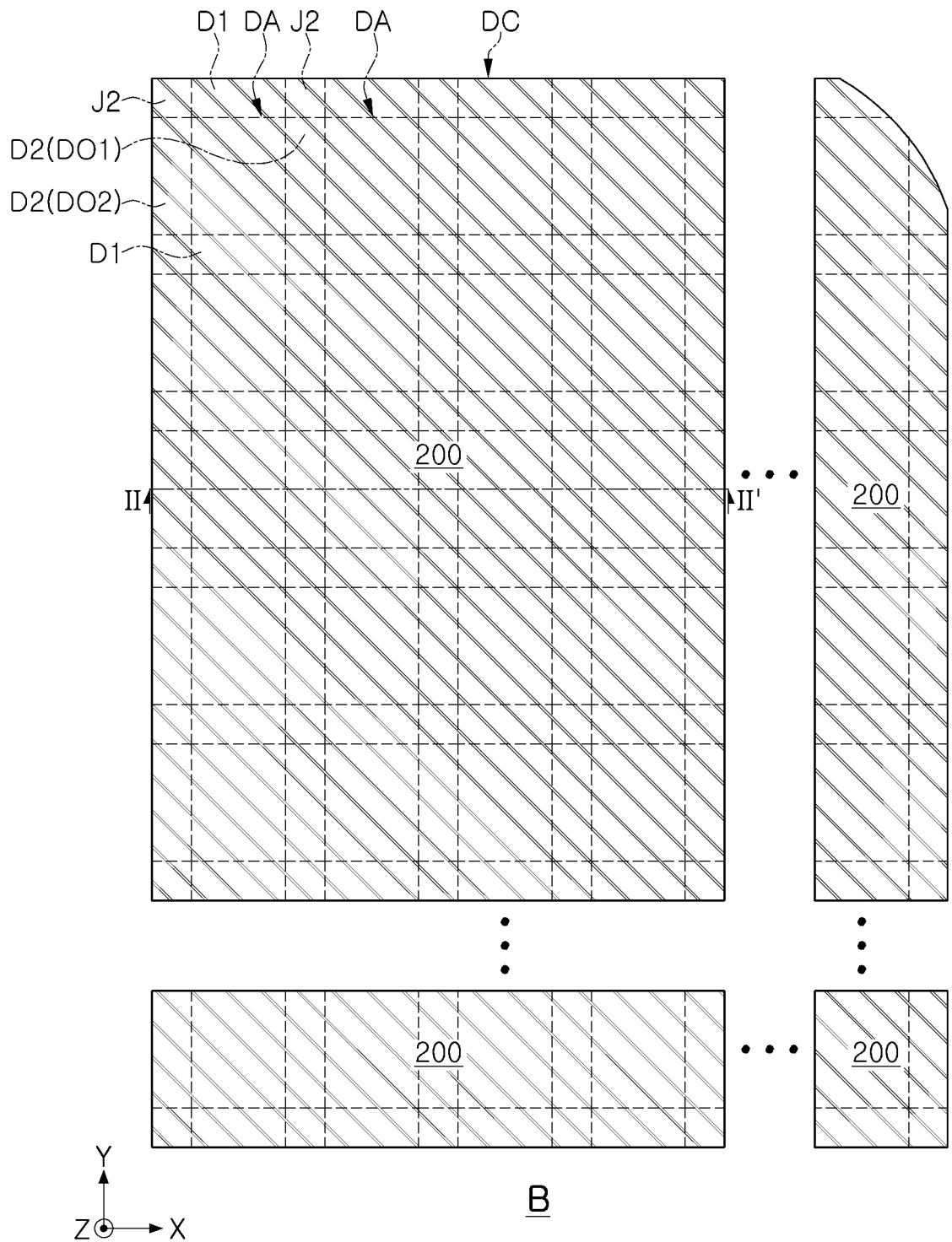
FIG. 3A is a first view, that is a cross-sectional view along lines I-I' and illustrating a part of a process sequence to explain a method of manufacturing a semiconductor device according to an example embodiment of the present disclosure.
Figure 3B:
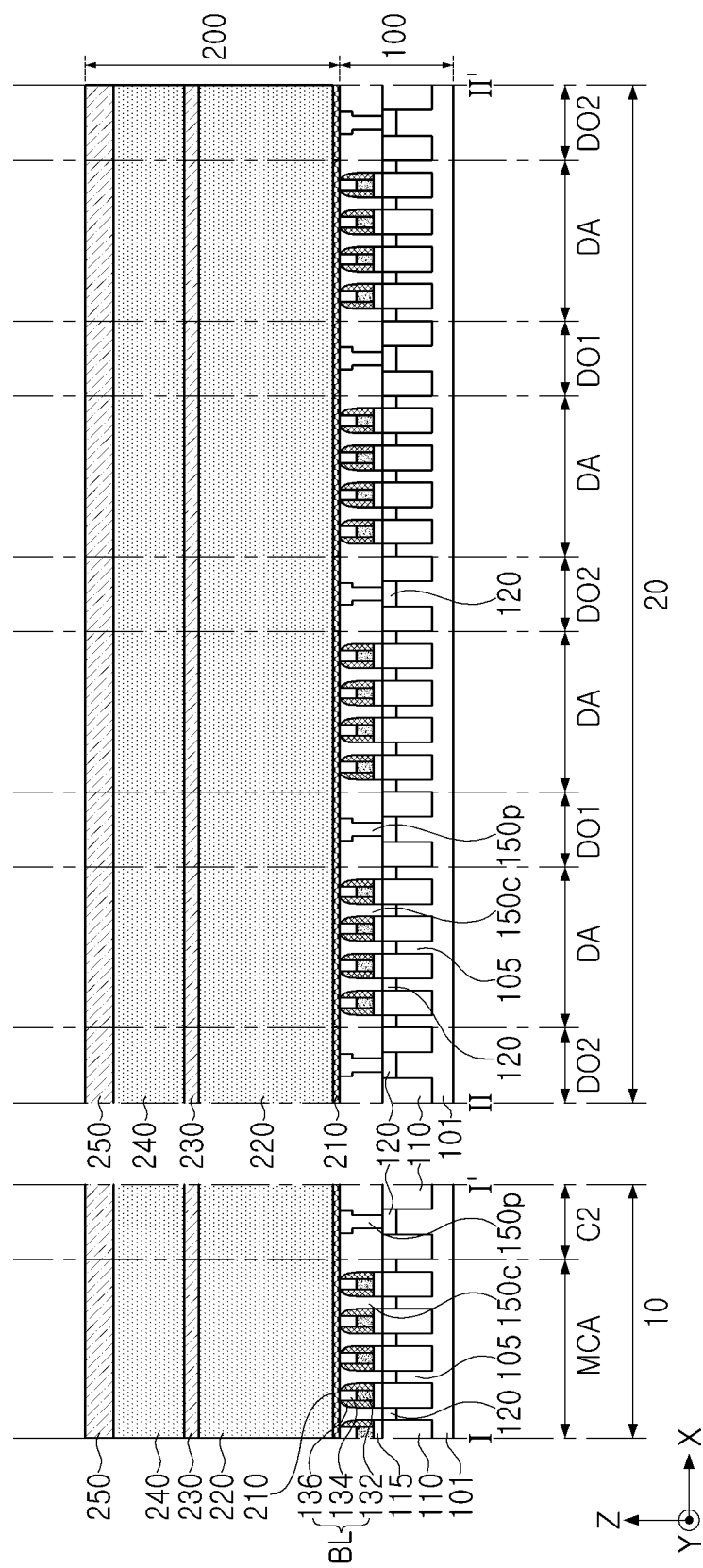
FIG. 3B is a second view, that is a cross-sectional view along lines I-I' and illustrating a part of the process sequence to explain the method of manufacturing the semiconductor device according to the example embodiment of the present disclosure.

In an example embodiment, the PSES structure (PSES) may include a dummy structure formed by patterning a mold structure 200 (refer to FIG. 3B). The insulating structure may include an etch stop layer 210, a first mold pattern 220D, a first support pattern 230D, a second mold pattern 240D, and a second support pattern 250D (refer to FIG. 10) sequentially stacked on a lower structure 100 (refer to FIG. 10). In an example embodiment, the PSES structure (PSES) may further include an electrode layer 280 (refer to FIG. 10) on the second support pattern 250D.

By the arrangement of the PSES structure (PSES), a ratio of a high step portion and a low step portion among the steps of an interlayer insulating layer may be adjusted. If the ratio of the high step portion is high, a residue of the interlayer insulating layer may occur on the edge region of the wafer structure 1 during a CMP process, and if the ratio of the low step portion is high, a defect in which structures (e.g., first mold pattern 220D and second mold pattern 240D in FIG. 7) disposed under the interlayer insulating layer collapse due to the stress of the CMP process may occur in the edge region of the wafer structure 1 during the CMP process.

Since the PSES structure (PSES) has the arrangement as illustrated in FIG. 2B, the rate of step removal of the interlayer insulating layer in all regions including the edge region 20 of the wafer structure 1 during the CMP process may be optimized. In particular, as the scale or node of the plurality of the memory cell region MCA of the chip region 10 decreases, there is a problem in that the ratio of the low step portion of the interlayer insulating layer is reduced on the edge region 20, and the rate of removing the steps is reduced during the CMP process, resulting in an occurrence of the residue of the interlayer insulating layer. According to the example embodiment of the present disclosure, the occurrence of the residue may be suppressed by providing the PSES structure (PSES) arranged in a zigzag arrangement on the edge region 20 to suppress local stress concentration by the CMP process, and increasing the ratio of the lower step portion of the interlayer insulating layer to increase the rate of step removal of the CMP process. Accordingly, a wafer structure including a semiconductor device having improved reliability and a method of manufacturing a semiconductor device may be provided.

FIGS. 3A to 10 are views illustrating a process sequence to explain a method of manufacturing a semiconductor device according to an example embodiment of the present disclosure.

Referring to FIGS. 2A, 2B, 3A, and 3B, the lower structure 100 including the substrate 101 having the chip region 10 and the edge region 20 and the mold structure 200 on the lower structure 100 may be formed. The substrate 101 may be a semiconductor substrate, and may be a substrate included in the wafer structure 1.

The forming of the lower structure 100 may include forming an isolation region 110 defining active regions and peripheral active regions, forming bit line structures BL, and forming contact plugs (e.g. a cell contact plug 150c and a peripheral contact plug 150p).

First, trenches may be formed by anisotropically etching the substrate 101 using a mask layer according to a shallow trench isolation (STI) process. The isolation region 110 may be formed by depositing insulating materials in the trenches and then performing a planarization process. An impurity region 120 may be formed by implanting impurities into the substrate 105 before the isolation region 110 is formed. However, according to example embodiments, the impurity region 120 may be formed after the isolation region 110 is formed or in another process step.

Next, gate trenches extending in the first direction X in the substrate 101 may be formed, and gate dielectric layers and gate electrode layers may be formed in the gate trenches to form word lines.

Next, bit line structures BL extending in the second direction Y may be formed on the substrate 101. The forming of the bit line structures BL may include forming bit lines 132 and bit line capping layers 134 that are sequentially stacked, and forming bit line spacers 136 on side surfaces of the bit lines 132 and the bit line capping layers 134 that are sequentially stacked. In the process step of forming the bit lines 132, circuit gate electrodes may be formed on the peripheral region PERI of the chip region 10 of the substrate 101. The circuit gate electrodes may be gate electrodes constituting circuit elements in the peripheral region PERI. The bit lines 132 and the circuit gate electrodes may be formed of a conductive material.

The bit lines 132 may be formed on an insulating layer 115 on the substrate 101. The bit line capping layers 134 may be formed of an insulating material such as silicon nitride. The bit line spacers 136 may be formed of an insulating material such as silicon nitride.

Next, contact plugs (e.g. a cell contact plug 150c and a peripheral contact plug 150p) disposed between the bit line structures BL and electrically connected to the impurity region 120 may be formed. Before the contact plugs are formed, a lower interlayer insulating layer covering the bit line structures BL may be formed. The contact plugs may penetrate through the lower interlayer insulating layer to be connected to the impurity region 120. The contact plugs may include a cell contact plug 150c disposed in the memory cell region MCA and a peripheral contact plug 150p disposed in the peripheral region PERI.

The isolation region 110, the impurity region 120, the word lines, the bit line structures BL, and the circuit gate electrodes may be formed on the chip region 10 and the edge region 20 of the substrate 101. In an example embodiment, the isolation region 110, the impurity region 120, the word lines, the bit line structures BL, and the circuit gate electrodes may be formed only on the chip region 10 of the substrate 101.

The mold structure 200 may be formed on the lower structure 100. The forming of the mold structure 200 may include forming an etch stop layer 210, a first mold layer 220, a first support layer 230, a second mold layer 240, and a second support layer 250.

The first mold layer 220 and the second mold layer 240 may be formed of silicon oxide. The first support layer 230 and the second support layer 250 may be formed of an insulating material having etching selectivity with the first mold layer 220 and the second mold layer 240. For example, the first support layer 230 and the second support layer 250 may be formed of SiN or SiCN. The etch stop layer 210 may be formed of an insulating material having etch selectivity with the first mold layer 220, for example, SiN or SiCN.

Figure 4:
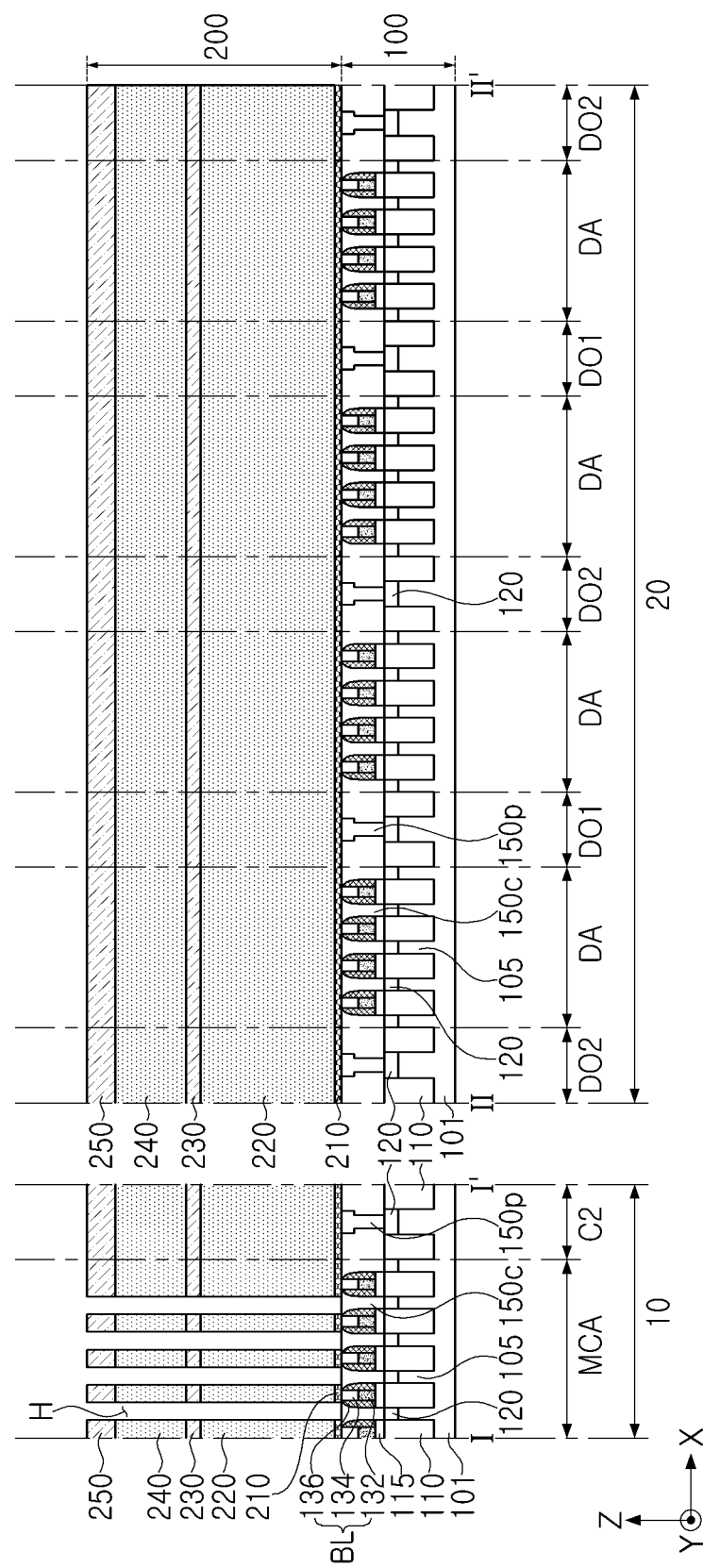
FIG. 4 is a third view, that is a cross-sectional view along lines I-I' and illustrating a part of the process sequence to explain the method of manufacturing the semiconductor device according to the example embodiment of the present disclosure.

Referring to FIGS. 2A, 2B, and 4, holes H penetrating through the mold structure 200 may be formed by patterning the mold structure 200 on the memory cell region MCA of the chip region 10 of the substrate 101.

After forming a separate mask layer on the mold structure 200, the mask layer may be patterned using a photolithography process, and the mold structure 200 may be etched by using the patterned mask layer as an etching mask to form the hole H exposing the contact plugs. The holes H may not be formed on the peripheral circuit region PERI of the chip region 10 and the edge region 20.

Figure 5:
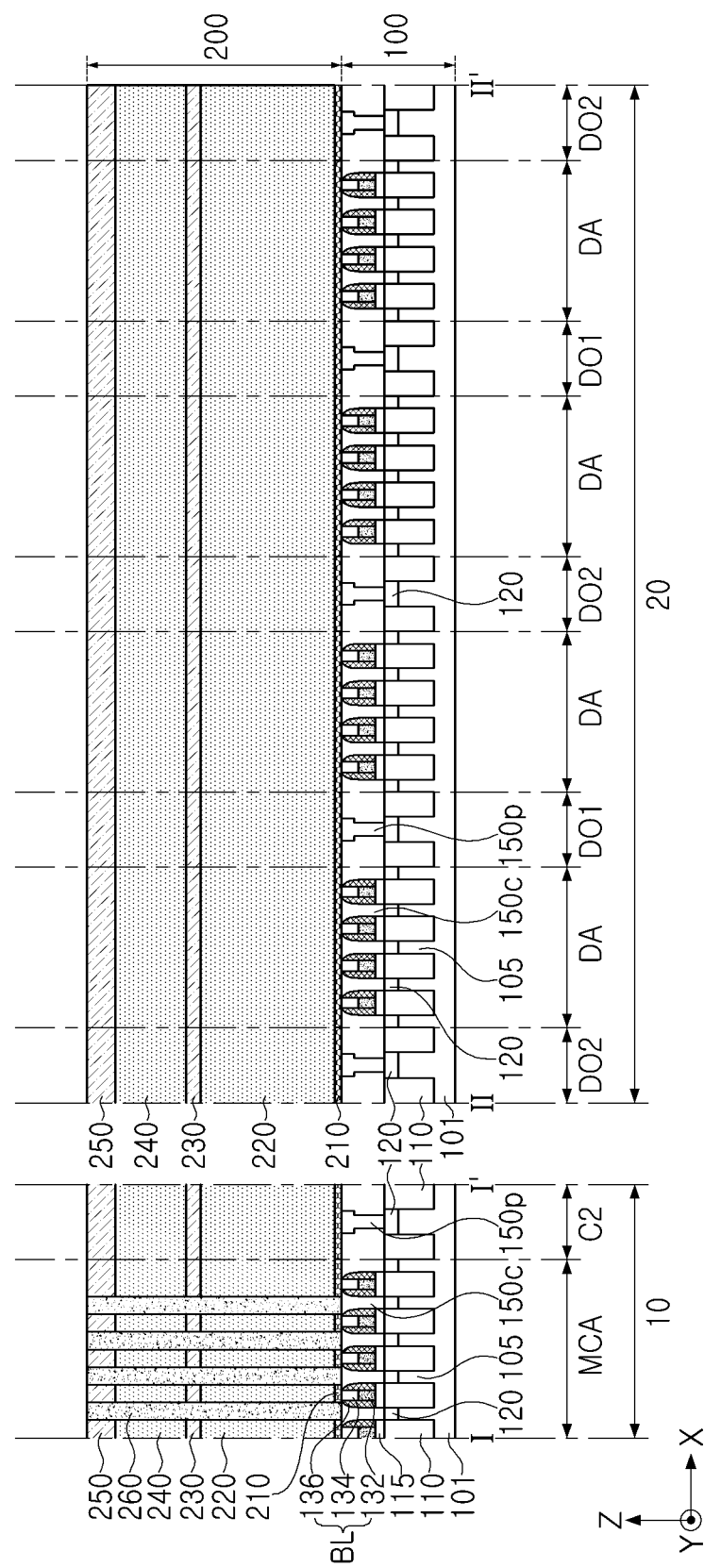
FIG. 5 is a fourth view, that is a cross-sectional view along lines I-I' and illustrating a part of the process sequence to explain the method of manufacturing the semiconductor device according to the example embodiment of the present disclosure.

Referring to FIGS. 2A, 2B, and 5, conductive layers 260 filling each of the holes H may be formed.

The conductive layers 260 may be formed on positions overlapping a plurality of the cell contact plug 150c. The conductive layers 260 may include a conductive material such as metal, metal nitride, metal oxide, metal silicide, conductive carbon, or a combination thereof. For example, the conductive layers 260 may include Ti, TiN, TiAlN, TiCN, Ta, TaN, TaAlN, TaCN, Ru, Pt, or a combination thereof. The conductive layers 260 are illustrated to have a pillar shape, but are not limited thereto. For example, the conductive layers 260 may have a cylinder shape.

Referring to FIGS. 2A, 2B, 6A, and 6B, the mold structure 200 may be patterned by forming first mask patterns 201a and second mask patterns 201b on the mold structure 200 and using the first mask patterns 201a and the second mask patterns 201b as an etch mask.

The first mask patterns 201a may be patterns for forming support patterns in the chip region 10. The first mask patterns 201a may cover a portion of the second support layer 250 and portions of the conductive layers 260 on the memory cell regions MCA of the chip region 10. The first mask patterns 201a may not cover the portion of the second support layer 250 on the peripheral region PERI of the chip region 10.

The second mask patterns 201b may cover a portion of the second support layer 250 on the edge region 20 in an arrangement corresponding to the arrangement of the PSES structure (PSES) as illustrated in FIG. 2B. The second mask patterns 201b may be arranged in a zigzag arrangement in the second direction Y on the mold structure 200. The second mask patterns 201b may be aligned in the first direction X, and at least some of the second mask patterns 201b may not be aligned in the second direction Y.

On the chip region 10, the mold structure 200 may be patterned to form support patterns connecting the conductive layers 260. The first support layer 230 and the second support layer 250 of the mold structure 200 may be patterned to form a lower support pattern 230P and an upper support pattern 250P. Some of the first mold layer 220 and the second mold layer 240 of the mold structure 200 may be removed so that side surfaces of the conductive layers 260 may be exposed. The first mask patterns 201a and the second mask patterns 201b may be removed after etching the mold structure 200 or while etching the mold structure 200. For example, the second mold layer 240 may be exposed while forming an upper support pattern 250P by etching the second support layer 250 of the mold structure 200 using the first mask patterns 201a as an etching mask, the first support layer 230 may be exposed by etching the second mold layer 240, the first mold layer 220 may be exposed while forming a lower support pattern 230P by etching the first support layer 230, and the first mold layer 220 may be etched and removed. The etch stop layer 210 may remain even after the first mold layer 220 and the second mold layer 240 are removed. The lower support pattern 230P and the upper support pattern 250P may prevent defects such as collapse or warping of the conductive layers 260 from occurring.

Figure 6A:
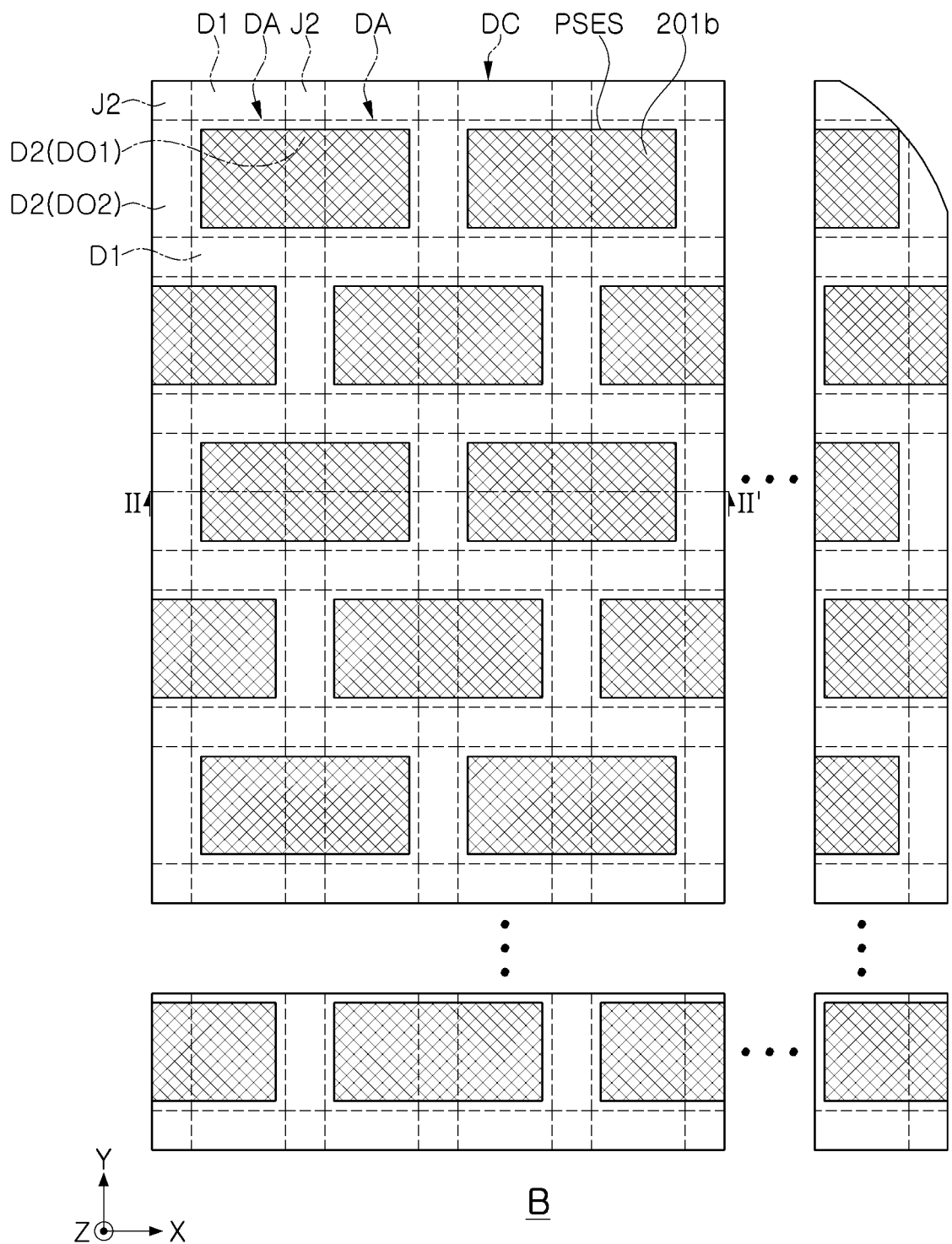
FIG. 6A is a fifth view illustrating a part of the process sequence to explain the method of manufacturing the semiconductor device according to the example embodiment of the present disclosure.
Figure 6B:
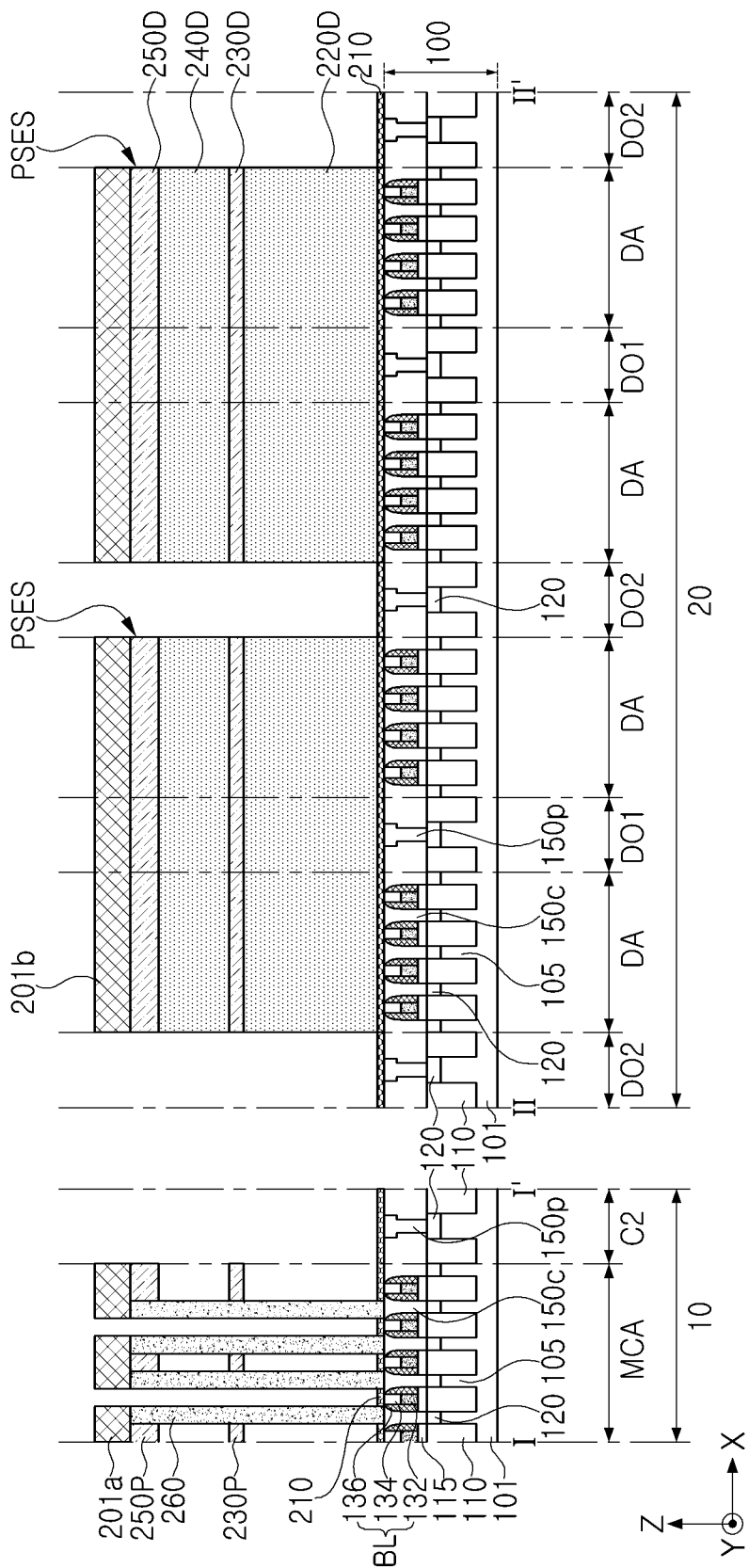
FIG. 6B is a sixth view, that is a cross-sectional view along lines I-I' and illustrating a part of the process sequence to explain the method of manufacturing the semiconductor device according to the example embodiment of the present disclosure.

On the edge region 20, the mold structure 200 may be patterned to form a PSES dummy structure. In the step, as illustrated in FIG. 6A, an arrangement of the plurality of the PSES structure (PSES) may be formed. That is, a plurality of the PSES structure (PSES) are spaced apart from each other in the first direction X and the second direction Y, respectively, in an island type and may be formed to have a zigzag arrangement in one direction. On the edge region 20, the first support layer 230 and the second support layer 250 of the mold structure 200 may be patterned to be formed as a first support pattern 230D and a second support pattern 250D, and the first mold layer 220 and the second mold layer 240 of the mold structure 200 may be patterned to be formed as a first mold pattern 220D and a second mold pattern 240D. The ratio of each of the low and high step portions of the interlayer insulating layer in a subsequent process may be determined by the arrangement and shape of the PSES structure (PSES) in the edge region 20. The PSES structure (PSES) may be referred to as a dummy structure.

Referring to FIGS. 2A, 2B, and 7, a dielectric layer 270 conformally covering the etch stop layer 210, the lower support pattern 230P, the upper support pattern 250P, the conductive layers 260, and an electrode layer 280 covering the conductive layers 260 and the lower support pattern 230P and upper support pattern 250P may be formed while filling the conductive layers 260 on the dielectric layer 270.

The dielectric layer 270 may include a high-k dielectric, silicon oxide, silicon nitride, silicon oxynitride, or a combination thereof. The electrode layer 280 may include a conductive material such as a metal, a metal nitride, a conductive carbon, a conductive semiconductor alloy, or a combination thereof. The semiconductor alloy may include a doped SiGe material. The dielectric layer 270 and the electrode layer 280 may be stacked on the upper support pattern 250P of the memory cell region MCA of the chip region 10. The dielectric layer 270 and the electrode layer 280 may be stacked on the PSES structure (PSES) in the edge region 20. The dielectric layer 270 and the electrode layer 280 stacked on the peripheral region PERI and the dummy core region DC may be removed by additionally forming a separate mask and then using the mask as an etching mask.

The electrode layer 280, the dielectric layer 270, and at least one of the conductive layers 260 may constitute a capacitor capable of storing data in a memory cell array of the DRAM element. For example, the at least one of the conductive layers 260 may be a lower electrode or a storage node of the capacitor of the DRAM element, and the electrode layer 280 may be an upper electrode or a plate electrode of the capacitor of the DRAM element. Accordingly, the mold structure 200 may be formed on the chip region 10 as the data storage structure SA including the capacitor of the DRAM element.

Referring to FIGS. 2A, 2B, 8A, and 8B, an interlayer insulating layer 290 (refer to FIGS. 9A and 9B) may be formed on the substrate 101.

The interlayer insulating layer 290 may be formed on the chip region 10 and the edge region 20 and may be formed to cover the data storage structure SA of the memory cell region MCA and the PSES structure PSES of the edge region 20. The interlayer insulating layer may be formed to have steps by patterned structures on the substrate 101. For example, the interlayer insulating layer 290 may include high step portions 290a and low step portions 290b. The high step portions 290a may be formed on the memory cell region MCA of the chip region 10, and the low step portions 290b may be formed on the peripheral region PERI. High step portions 290*aa* may be formed on the PSES structure (PSES) of the edge region 20, and low step portions 290*bb* may be formed on the region in which the PSES structure (PSES) is not disposed.

Figure 8A:
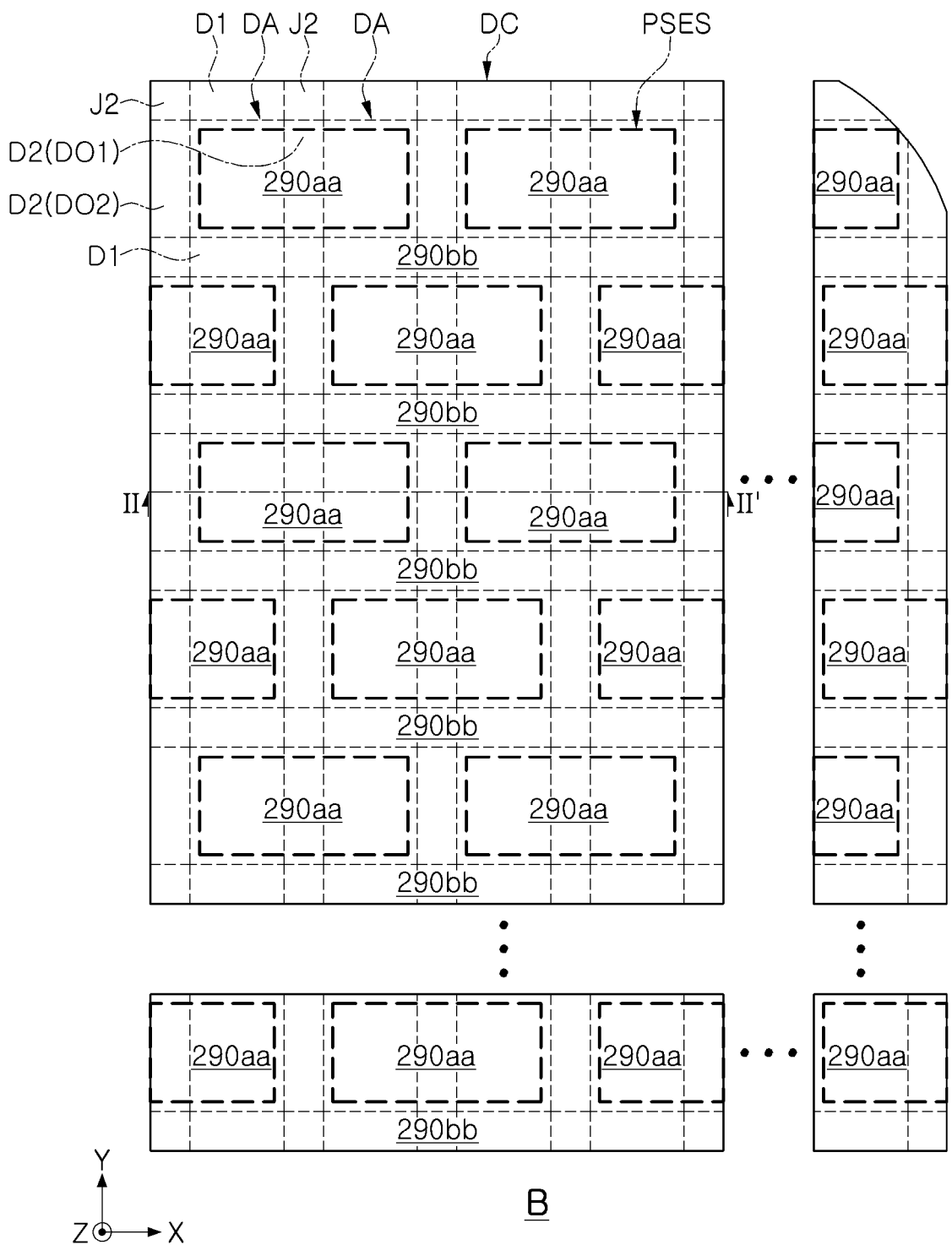
FIG. 8A is an eight view illustrating a part of the process sequence to explain the method of manufacturing the semiconductor device according to the example embodiment of the present disclosure.
Figure 8B:
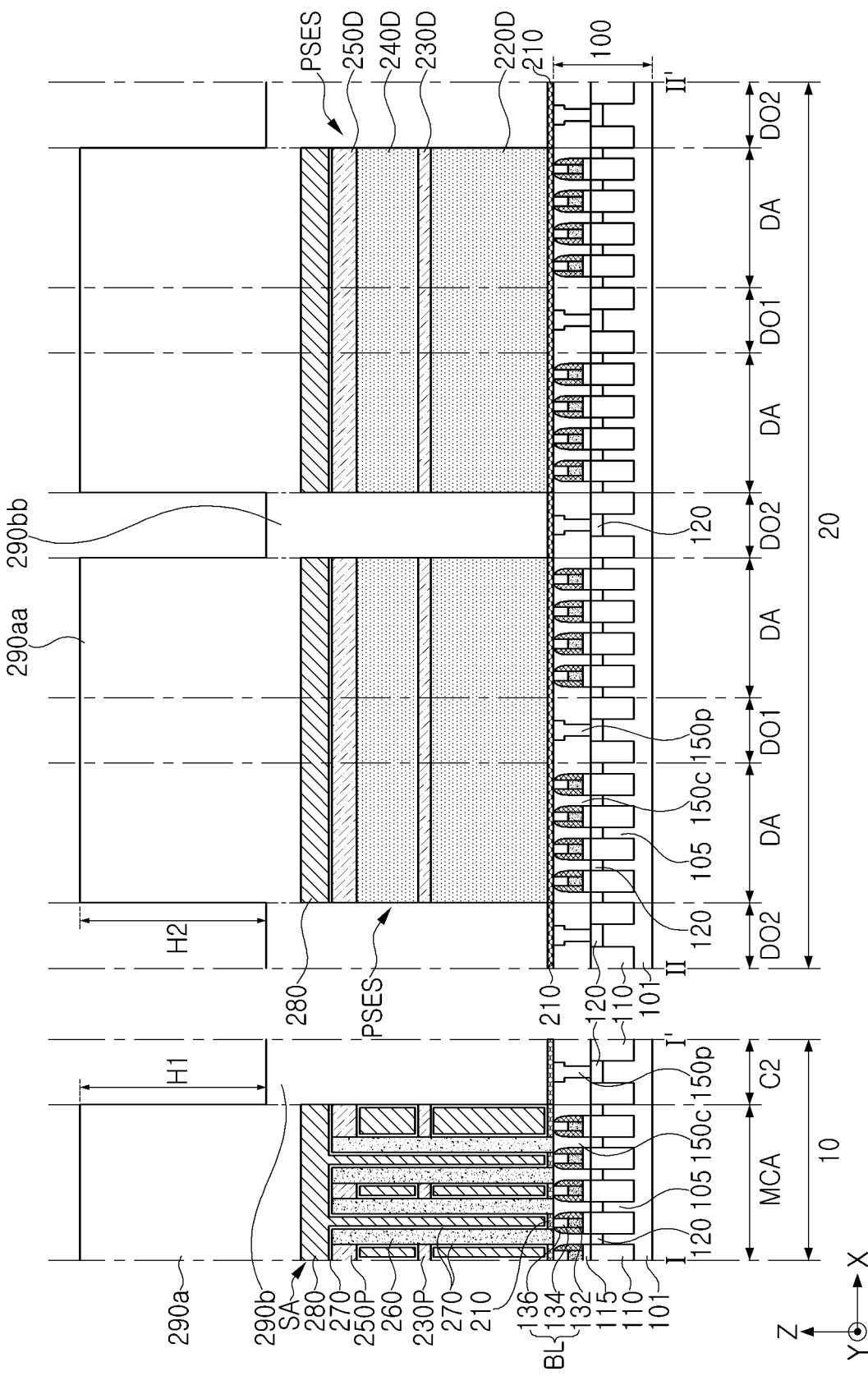
FIG. 8B is a ninth view, that is a cross-sectional view along lines I-I' and illustrating a part of the process sequence to explain the method of manufacturing the semiconductor device according to the example embodiment of the present disclosure.
Figure 9A:
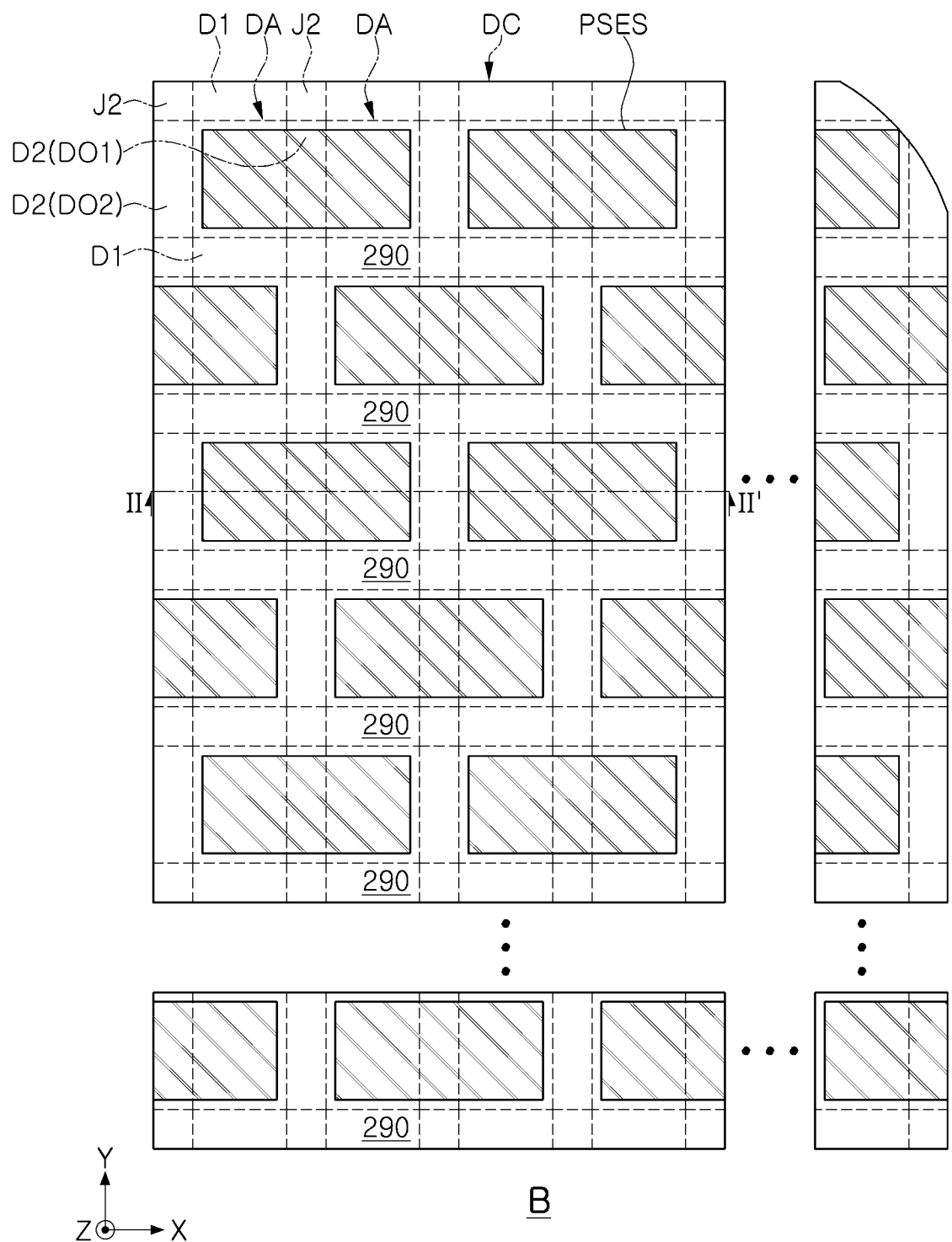
FIG. 9A is a tenth view illustrating a part of the process sequence to explain the method of manufacturing the semiconductor device according to the example embodiment of the present disclosure.
Figure 9B:
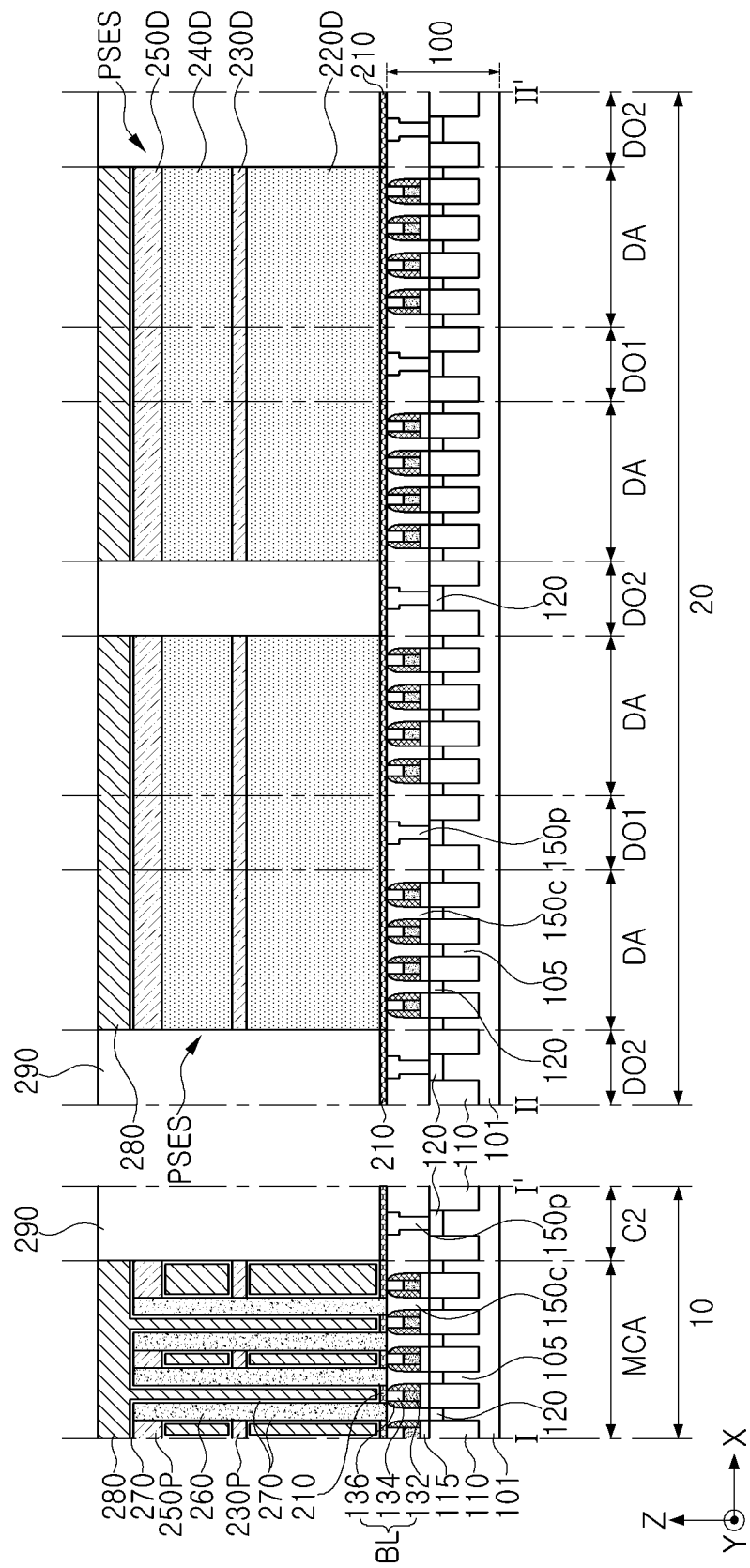
FIG. 9B is an eleventh view, that is a cross-sectional view along lines I-I' and illustrating a part of the process sequence to explain the method of manufacturing the semiconductor device according to the example embodiment of the present disclosure.

As illustrated in FIG. 8A, in the edge region 20, the low step portions 290*bb* may be formed to surround the plurality of the PSES structure (PSES), respectively, by being interposed in regions in which the plurality of the PSES structure (PSES) are spaced apart from each other. In the edge region 20, the high step portions 290*aa* may be formed in a zigzag arrangement corresponding to the zigzag arrangement of the plurality of the PSES structure (PSES). The high step portions may be located at a level having an upper end higher than an upper end of the low step portions.

In the chip region 10, the upper ends of the high step portions 290*a* may be located at a level higher than the upper ends of the low step portions 290*b* by a first height H1. In the edge region 20, the upper ends of the high step portions 290*aa* may be located at a level higher than the upper ends of the low step portions 290*bb* by a second height H2. In an example embodiment, the first height H1 may be substantially the same as the second height H2. In an example embodiment, the first height H1 may be different from the second height H2.

The interlayer insulating layer 290 may be formed by using silicon oxide such as borosilicate glass (BSG), phosphoSilicate glass (PSG), boroPhosphoSilicate Glass (BPSG), Undoped Silicate Glass (USG), TetraEthyl OrthoSilicate Glass (TEOS), or High Density Plasma-CVD (HDP-CVD).

Referring to FIGS. 2A, 2B, 9A, and 9B, a portion of the interlayer insulating layer 290 may be removed to expose the electrode layer 280 using a planarization process.

The planarization process may be a chemical mechanical polishing (CMP) process. By the planarization process, an upper surface of the interlayer insulating layer 290 and an upper surface of the electrode layer 280 may be substantially coplanar. As described above, as the PSES structure (PSES) arranged in a zigzag arrangement is provided in the edge region 20, the high step portions 290*aa* may also have an arrangement and shape corresponding to the arrangement and shape of the PSES structure (PSES). Since the low step portions 290*bb* of the interlayer insulating layer 290 may also be formed by patterning the mold structure in the second dummy core region C2 as compared to the low step portions arranged to correspond to only the first dummy core region C1, a ratio of the lower step portion may be relatively increased. Accordingly, the rate of step removal of the CMP process in the edge region 20 may be improved.

On the other hand, in order to prevent the concentration of local stress by the CMP process, there are restrictions on design setting of the PSES structure (PSES). In order to prevent collapse of the lower structure due to local stress caused by the CMP process, the PSES structure (PSES) may be designed to have a minimum width or more. The minimum width may be, for example, about 40 μm. When the PSES structure (PSES) has a minimum width of less than about 40 μm and has the same arrangement as the memory cell regions MCA, it was confirmed in a subsequent process that cracks and voids occurred in the mold structure. When the minimum width of the PSES structure (PSES) was about 40 μm or more, the phenomenon as described above did not occur.

Meanwhile, the ratio of the low step portions and the high step portions of the interlayer insulating layer 290 in the edge region 20 may be determined according to an area of the region in which the PSES structure (PSES) is disposed. The ratio may be calculated from a first area of a first region in which the PSES structure (PSES) is disposed in the edge region 20 and a second area of the second region in which the PSES structure (PSES) is not disposed. For example, a ratio of the first area of the first region to the total area of the edge region 20 may be defined as a ratio of the high step portions or a ratio of the PSES region. In example embodiments, the ratio of the PSES region may range from about 76% to about 83%. In example embodiments, the ratio of the PSES region may range from about 78% to about 81%. When the ratio of the PSES region is higher than the above-mentioned range, there may be a problem that a residue of the interlayer insulating layer occurs during the CMP process, and when the ratio of the PSES region is smaller than the above-mentioned range, a problem due to local stress concentration may occur during the CMP process.

Figure 10:
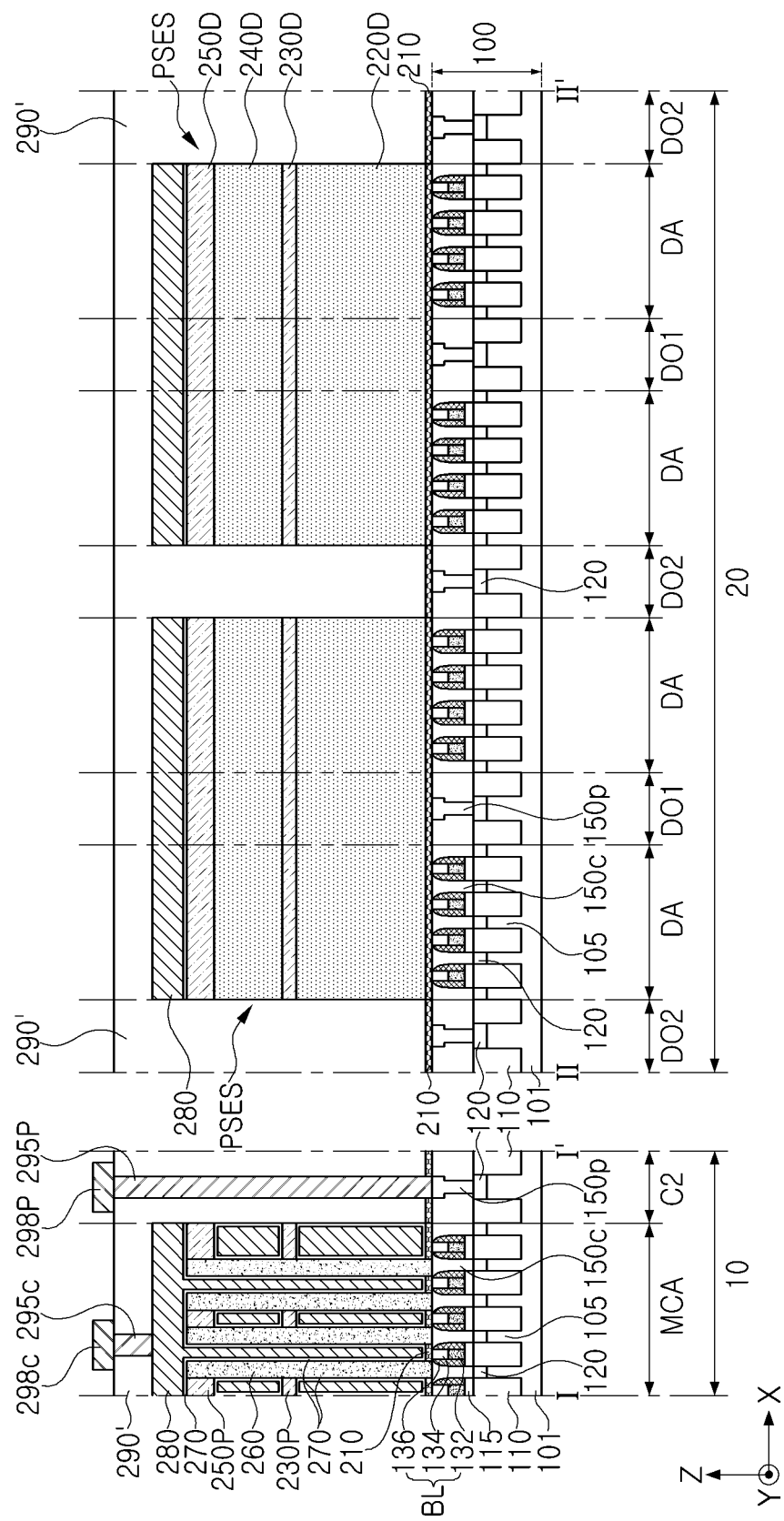
FIG. 10 is an eleventh view, that is a cross-sectional view along lines I-I' and illustrating a part of the process sequence to explain the method of manufacturing the semiconductor device according to the example embodiment of the present disclosure.

Referring to FIGS. 2A, 2B, and 10, an insulating layer may be additionally deposited to form an interlayer insulating layer 290', and contact structures (e.g. a cell contact structure 295*c* and a peripheral contact structure 295*p*) and upper wirings 298*c* and 298*p* may be formed.

The contact structures may include a cell contact structure 295*c* that penetrates through the interlayer insulating layer 290' and is connected to the electrode layer 280, and a peripheral contact structure 295*p* that penetrates through the interlayer insulating layer 290' and is connected to the peripheral contact plug 150*p*. The upper wirings 298*c* and 298*p* may be formed on the interlayer insulating layer 290' to be connected to the cell contact structure 295*c* and the peripheral contact structure 295*p*, respectively.

FIGS. 11 to 13 are partially enlarged views corresponding to the region "B" of FIG. 1 and are plan views schematically illustrating a layout of an edge region of the wafer structure.

Referring to FIG. 11, the arrangement and shape of the PSES structure (PSESa) in an edge region 20A may be different from the example embodiment of FIG. 2B. The PSES structure (PSESa) is arranged in a zigzag arrangement, but has a larger size than the data storage structure SA of the memory cell regions MCA, and may be disposed over three dummy cell regions DA adjacent to each other in the first direction X and two overlapping portions DO1 of the second dummy core region D2 disposed therebetween. A pair of overlapping portions DO1 and a non-overlapping portion DO2 may be alternately arranged in the first direction X.

The PSES structure (PSESa) may have a second width W2*a*, greater than the first width W1 of the data storage structure SA of FIG. 2A. The PSES structure (PSESa) may be arranged at a second pitch S2*a* that is greater than the first pitch S1 in the first direction X. The second width W2*a* may be relatively greater than the second width W2 of FIG. 2B. The second pitch S2*a* may be relatively greater than the second pitch S2 of FIG. 2B.

In an example embodiment, the second width W2*a* may be greater than about 3 times the first width W1 of the data storage structure SA of FIG. 2A. The second width W2 may be about 3 times to about 4 times the first width W1. A relative ratio of the second width W2*a* and the first width W1 may be variously changed according to example embodiments, but since adjacent PSES structures in the first direction X are spaced apart from each other, the second width of the PSES structure in the first direction X may have a predetermined upper limit value.

Referring to FIG. 12, the arrangement and shape of PSES structure (PSESb) in an edge region 20B may be different from the example embodiment of FIG. 2B. The PSES structure (PSESb) is arranged in a zigzag arrangement, but has a larger size than the data storage structure SA of the memory cell regions MCA, and may be disposed over an overlapping portion DO1 of a pair of dummy cell regions DA adjacent to each other in the second direction Y and the first dummy core region D1 disposed therebetween. The overlapping portion DO1 and the non-overlapping portion DO2 of the first dummy core region D1 may be alternately arranged in the first direction X, and may be alternately arranged in the second direction Y.

A width W2b of the PSES structure (PSESb) in the second direction Y may be greater than the width of the data storage structure SA of the memory cell regions MCA of FIG. 2A in the second direction Y. A second pitch S2b of the PSES structure (PSESb) in the second direction Y may be greater than the pitch of the data storage structure SA of FIG. 2A in the second direction Y.

In an example embodiment, the width W2b of the PSES structure (PSESb) in the second direction Y may be greater than about twice the width of the data storage structure SA of FIG. 2A in the second direction Y, or may be about 2 times to 3 times. In an example embodiment, the second pitch S2b may be greater than the pitch of the data storage structure SA of FIG. 2A in the second direction Y.

Each two of the PSES structure (PSESb) arranged adjacently in the second direction Y are aligned with each other in the second direction Y, but each two of the PSES structure (PSESb) arranged adjacently in the first direction X may not be aligned with each other in the first direction X. The plurality of the PSES structure (PSESb) may be arranged in a zigzag arrangement in the first direction X.

Referring to FIG. 13, the arrangement and shape of PSES structure (PSESc) in an edge region 20C may be different from the example embodiment of FIG. 2B. The PSES structure (PSESc) may be arranged in a zigzag arrangement, and may have a size greater than the data storage structure SA on the memory cell regions MCA of FIG. 2A. A width W2x in the first direction X and a width W2y in the second direction Y of the PSES structure (PSESc) may be greater than the width in the first direction X and the width in the second direction Y of the data storage structure SA of the memory cell regions MCA of FIG. 2A, respectively. A pitch S2x in the first direction X and a pitch S2y in the second direction Y of the PSES structure (PSESc) may be greater than the pitch in the first direction X and the pitch in the second direction Y of the data storage structures SA of the memory cell regions MCA of FIG. 2A.

The PSES structure (PSESc) may overlap an overlapping portion DO1a of the first dummy core region D1 and an overlapping portion DO1b of the second dummy core region D2. The PSES structure (PSESc) may overlap the second conjunction region J2 of a region in which the overlapping portions DO1a and DO1b intersect.

According to the arrangement and shape of the PSES structures in the edge region described above with reference to FIGS. 11 to 13, the rate of step removal of the interlayer insulating layer during the CMP process may be controlled.

The present disclosure is not limited by the above-described example embodiments and the accompanying drawings. Accordingly, various types of substitutions, modifications and alterations and combinations of example embodiments will be possible by those of ordinary skill in the art within the scope not departing from the technical spirit of the present disclosure, and this also belongs to the scope of the present disclosure.

According to example embodiments, by arranging Photo-Sensitive-Edge-Stop (PSES) structures on the edge region of the substrate in a zigzag arrangement, the rate of step removal of the interlayer insulating layer may be controlled during the planarization process. Therefore, the method of manufacturing a semiconductor device having improved reliability, and a wafer structure including a semiconductor device formed thereby may be provided.

Various advantages and effects of embodiments of the present disclosure are not limited to the description above, and may be more readily understood in the description of example embodiments of the present disclosure.

What is claimed is:

1. A method of manufacturing a semiconductor device, the method comprising:
    forming a lower structure that includes a substrate and conductive lines on the substrate, within a chip region and an edge region of the lower structure;
    forming data storage structures on the chip region of the lower structure;
    forming dummy structures on the edge region of the lower structure;
    forming an interlayer insulating layer covering the data storage structures and the dummy structures on the lower structure, the interlayer insulating layer including high step portions and low step portions, an upper end of the low step portions being lower than an upper end of the high step portions, and an entirety of each of the low step portions are in a non-overlapped state with respect to an entirety of each of the high step portions in a vertical direction of the semiconductor device; and
    planarizing the interlayer insulating layer,
    wherein on the chip region, the lower structure includes a core region having a grid pattern, and further includes memory cell regions surrounded by the core region,
    wherein on the edge region, the lower structure includes a dummy core region having a same grid pattern as the core region, and further includes dummy cell regions surrounded by the dummy core region,
    wherein the data storage structures are respectively formed on the memory cell regions,
    wherein each of the dummy structures is formed to overlap two adjacent ones of the dummy cell regions and a portion of the dummy core region therebetween, and
    wherein the high step portions are respectively formed on the memory cell regions and the dummy structures, and the low step portions are respectively formed on the core region and regions between the dummy structures.

2. The method of claim 1, wherein the dummy structures are formed in an island type in a plan view and are arranged in a zigzag arrangement.

3. The method of claim 1, wherein the data storage structures are formed at a first pitch in a first direction, and
    wherein the dummy structures are formed at a second pitch greater than the first pitch in the first direction.

4. The method of claim 1, wherein each of the data storage structures has a first width in a first direction, and
    wherein each of the dummy structures has a second width greater than the first width in the first direction.

5. The method of claim 1, wherein the forming of the dummy structures comprises:
    forming a mold structure on the lower structure;
    forming mask patterns arranged in a zigzag arrangement on the mold structure on the edge region; and
    etching the mold structure using the mask patterns as an etching mask.

6. The method of claim 5, the forming of the dummy structures further comprises removing the mask patterns during or after the etching the mold structure.

7. The method of claim 5, wherein the mold structure includes a first mold layer, a first support layer on the first mold layer, a second mold layer on the first support layer, and a second support layer on the second mold layer, and
wherein the etching of the mold structure comprises forming a first mold pattern, a second mold pattern, a first support pattern, and a second support pattern by patterning the first mold layer, the second mold layer, the first support layer, and the second support layer of the mold structure using the mask patterns on the edge region.

8. The method of claim 1, wherein the forming of the data storage structures comprises:
forming a mold structure on the lower structure;
forming holes penetrating through the mold structure on the memory cell regions; and
forming conductive layers filling the holes,
wherein on the edge region, holes penetrating through the mold structure are not formed.

9. The method of claim 8, wherein the mold structure includes a first mold layer, a first support layer on the first mold layer, a second mold layer on the first support layer, and a second support layer on the second mold layer,
the method further comprises, after the forming of the conductive layers, forming a lower support pattern and an upper support pattern by patterning the mold structure on the chip region, and
wherein on the chip region, the first mold layer and the second mold layer are removed, the first support layer is patterned and formed as the lower support pattern connecting the conductive layers, and the second support layer is patterned and formed as the upper support pattern connecting the conductive layers.

10. The method of claim 9, further comprising, after the forming of the lower support pattern and the upper support pattern:
forming a dielectric layer conformally covering the conductive layers, the lower support pattern, and the upper support pattern; and
forming an electrode layer on the dielectric layer.

11. The method of claim 1, wherein a ratio of a sum of areas of regions in which the dummy structures are disposed to a total area of the edge region ranges from about 76% to about 83%.

12. The method of claim 1, wherein a minimum width of each of the dummy structures is about 40 µm or more.

13. A method of manufacturing a semiconductor device, the method comprising:
forming a lower structure that includes a substrate and conductive lines on the substrate, within a chip region and an edge region of the lower structure;
forming data storage structures on the chip region of the lower structure, each of the data storage structures having a first width in a first direction;
forming dummy structures on the edge region of the lower structure, each of the dummy structures having a second width greater than the first width in the first direction;
forming an interlayer insulating layer covering the data storage structures and the dummy structures on the lower structure; and
planarizing the interlayer insulating layer,
wherein the dummy structures are formed to be spaced apart from each other in the first direction and in a second direction, intersecting the first direction,
wherein high step portions of the interlayer insulating layer are respectively formed on the dummy structures and memory cell regions of the chip region,
wherein low step portions, lower than the high step portions, of the interlayer insulating layer are respectively formed between the dummy structures and a peripheral circuit region of the chip region, and
wherein an entirety of each of the low step portions are in a non-overlapped state with respect to an entirety of each of the high step portions in a vertical direction of the semiconductor device.

14. The method of claim 13, wherein the dummy structures are formed in a different shape and arrangement than the data storage structures.

15. The method of claim 13, wherein the dummy structures are formed in an island type in a plan view and are arranged in a zigzag arrangement.

16. The method of claim 15, wherein on the edge region, the high step portions of the interlayer insulating layer are formed in a zigzag arrangement corresponding to the zigzag arrangement of the dummy structures.

17. The method of claim 1, wherein the core region includes a bit line sense amplifier (S/A) block of a memory element or a sub word line driver (SWD) block of the memory element.

18. The method of claim 13, wherein the peripheral circuit region includes a bit line sense amplifier (S/A) block of a memory element or a sub word line driver (SWD) block of the memory element.

* * * * *